(12) United States Patent
Kim et al.

(10) Patent No.: US 12,563,313 B2
(45) Date of Patent: Feb. 24, 2026

(54) IMAGE SENSING DEVICE

(71) Applicant: SAMSUNG ELECTRONICS CO., LTD., Suwon-si (KR)

(72) Inventors: Hyuncheol Kim, Suwon-si (KR); Eun Sub Shim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 206 days.

(21) Appl. No.: 17/590,327

(22) Filed: Feb. 1, 2022

(65) Prior Publication Data

US 2022/0408038 A1     Dec. 22, 2022

(30) Foreign Application Priority Data

Jun. 21, 2021     (KR) ........................ 10-2021-0079852

(51) Int. Cl.
H04N 25/59          (2023.01)
H04N 25/51          (2023.01)
(Continued)

(52) U.S. Cl.
CPC ............. H04N 25/59 (2023.01); H04N 25/51 (2023.01); H04N 25/766 (2023.01);
(Continued)

(58) Field of Classification Search
CPC ....... H04N 25/79; H04N 25/772; H04N 25/77
See application file for complete search history.

(56) References Cited

U.S. PATENT DOCUMENTS

| | | | |
|---|---|---|---|
| 7,745,779 B2 | 6/2010 | Conners | |
| 8,809,759 B2 | 8/2014 | Mo et al. | |

(Continued)

FOREIGN PATENT DOCUMENTS

| | | |
|---|---|---|
| JP | 2014-155157 A | 8/2014 |
| KR | 10-2008-0030091 A | 4/2008 |

(Continued)

OTHER PUBLICATIONS

Communication issued Aug. 21, 2025 by the Korean Intellectual Property Office in counterpart Korean Patent Application No. 10-2021-0079852.

*Primary Examiner* — Twyler L Haskins
*Assistant Examiner* — Wesley J Chiu
(74) *Attorney, Agent, or Firm* — Sughrue Mion, PLLC

(57)          ABSTRACT
An image sensing device includes a photoelectric element configured to generate an electric charge in response to light; first and second floating diffusions configured to store the electric charge; a transfer gate having a first end connected to the photoelectric element and a second end connected to the first floating diffusion; a reset transistor configured to reset voltages of the first and second floating diffusions based on a reset signal; a first dual conversion gain (DCG) transistor having a first end connected to the first floating diffusion and a second end connected to the second floating diffusion; first and second pixel circuits configured to generate first and second output voltages based on the first and second floating diffusions; and first and second analog to digital converters configured to receive the first and second output voltages and convert them to first and second digital signals.

7 Claims, 32 Drawing Sheets

(51) Int. Cl.

| | |
|---|---|
| *H04N 25/766* | (2023.01) |
| *H04N 25/77* | (2023.01) |
| *H04N 25/771* | (2023.01) |
| *H04N 25/772* | (2023.01) |
| *H04N 25/78* | (2023.01) |
| *H04N 25/79* | (2023.01) |
| *H10F 39/00* | (2025.01) |

(52) U.S. Cl.
CPC ........... *H04N 25/77* (2023.01); *H04N 25/771* (2023.01); *H04N 25/772* (2023.01); *H04N 25/78* (2023.01); *H04N 25/79* (2023.01); *H10F 39/803* (2025.01)

(56) References Cited

U.S. PATENT DOCUMENTS

| | | | |
|---|---|---|---|
| 9,728,565 B2 | 8/2017 | Fossum et al. | |
| 2008/0198251 A1 | 8/2008 | Xu | |
| 2012/0132787 A1* | 5/2012 | Mabuchi ................. | H10F 39/80 257/E31.124 |

| | | | |
|---|---|---|---|
| 2013/0099095 A1* | 4/2013 | Parks ..................... | H04N 25/59 250/208.1 |
| 2014/0239154 A1* | 8/2014 | Chen ..................... | H04N 23/741 257/292 |
| 2015/0288906 A1* | 10/2015 | Saito ..................... | H04N 25/772 348/305 |
| 2016/0141326 A1* | 5/2016 | Hanzawa .......... | H01L 27/14612 250/208.1 |
| 2021/0235026 A1* | 7/2021 | Xu .......................... | H04N 25/77 |
| 2021/0289156 A1* | 9/2021 | Hanzawa ............... | H04N 25/46 |
| 2021/0360175 A1* | 11/2021 | Dai ........................ | H04N 25/13 |
| 2022/0077207 A1* | 3/2022 | Ejiri ...................... | H10F 39/18 |
| 2022/0337774 A1* | 10/2022 | Oh ..................... | H01L 27/14612 |

FOREIGN PATENT DOCUMENTS

| | | | |
|---|---|---|---|
| KR | 10-2009-0012837 A | 2/2009 | |
| KR | 10-1030684 B1 | 4/2011 | |
| KR | 10-2012-0122165 A | 11/2012 | |
| KR | 10-2014-0111853 A | 9/2014 | |
| KR | 10-2020-0121060 A | 10/2020 | |

* cited by examiner

IMAGE SENSING DEVICE

CROSS-REFERENCE TO THE RELATED APPLICATION

This application claims priority from Korean Patent Application No. 10-2021-079852 filed on Jun. 21, 2021 in the Korean Intellectual Property Office, the disclosure of which is incorporated herein by reference in its entirety.

BACKGROUND

1. Field

The present disclosure relates to an image sensing device.

2. Description of Related Art

An image sensing device may be one of semiconductor elements that convert optical information into an electric signal. Such an image sensing device may include a Charge Coupled Device (CCD) image sensing device, a Complementary Metal-Oxide Semiconductor image (CMOS) (image sensing device, and the like.

As a method of implementing a High Dynamic Range (HDR) scene using a CMOS image sensor (CIS), a multiple exposure technique, a multiple conversion gain (MCG) technique and the like may be used. However, because such techniques go through a process of repeatedly reading data a plurality of times and then synthesizing the data, there is a problem of a decrease in frame rate.

SUMMARY

Provided are an image sensing device including a multiple floating diffusion and an analog to digital converter.

Also provided are a method of operating an image sensing device capable of implementing an HDR scene by a single read operation.

Additional aspects will be set forth in part in the description which follows and, in part, will be apparent from the description, or may be learned by practice of the presented embodiments.

In accordance with an aspect of the disclosure, an image sensing device includes a photoelectric element configured to generate an electric charge in response to light; a first floating diffusion configured to store the electric charge; a second floating diffusion configured to store the electric charge; a transfer gate, wherein a first end of the transfer gate is connected to the photoelectric element, and a second end of the transfer gate is connected to the first floating diffusion; a reset transistor configured to reset a voltage of the first floating diffusion and a voltage of the second floating diffusion based on a reset signal; a first dual conversion gain (DCG) transistor, wherein a first end of the first DCG transistor is connected to the first floating diffusion, and a second end of the first DCG transistor is connected to the second floating diffusion, and wherein the first DCG transistor is configured to connect the first floating diffusion and the second floating diffusion based on the first DCG control signal; a first pixel circuit configured to generate a first output voltage based on the voltage of the first floating diffusion; a second pixel circuit configured to generate a second output voltage based on the voltage of the second floating diffusion; a first analog to digital converter configured to receive the first output voltage and convert the first output voltage into a first digital signal; and a second analog to digital converter separate from the first analog to digital converter, and configured to receive the second output voltage and convert the second output voltage into a second digital signal.

In accordance with an aspect of the disclosure, an image sensing device includes a first pixel circuit configured to generate and output a first output voltage using a first conversion technique based on electric charge generated by a single photoelectric element; a first analog to digital converter configured to receive the first output voltage and convert the first output voltage into a first digital signal; a second pixel circuit configured to generate and output a second output voltage different from the first output voltage using a second conversion technique based on the electric charge generated by the single photoelectric element; and a second analog to digital converter configured to receive the second output voltage and convert the second output voltage to a second digital signal, wherein the first analog to digital converter is disposed on a first plate, and wherein the second analog to digital converter is disposed on a second plate different from the first plate.

In accordance with an aspect of the disclosure, a method of operating an image sensing device includes electrically connecting a first floating diffusion and a second floating diffusion based on a first DCG control signal; resetting a voltage level of the first floating diffusion and a voltage level of the second floating diffusion to a reset level; transitioning the voltage level of the first floating diffusion from the reset level to a first signal level, based on an electric charge generated from a photoelectric element; transitioning the voltage level of the second floating diffusion from the reset level to a second signal level different from the first signal level, based on the electric charge generated from the photoelectric element; electrically separating the first floating diffusion and the second floating diffusion based on the first DCG control signal; generating a first digital signal based on a level difference between the reset level and the first signal level of the first floating diffusion; and generating a second digital signal based on a level difference between the reset level and the second signal level of the second floating diffusion.

In accordance with an aspect of the disclosure, an image sensing device includes a first pixel circuit configured to generate and output a first output voltage using a first conversion gain based on electric charge generated by a single photoelectric element; a first analog to digital converter configured to receive the first output voltage and convert the first output voltage into a first digital signal; a second pixel circuit configured to generate and output a second output voltage different from the first output voltage using a second conversion gain based on the electric charge generated by the single photoelectric element; and a second analog to digital converter configured to receive the second output voltage and convert the second output voltage to a second digital signal, wherein the first conversion gain is higher than the second conversion gain.

BRIEF DESCRIPTION OF THE DRAWINGS

The above and other aspects, features, and advantages of certain embodiments of the present disclosure will be more apparent from the following description taken in conjunction with the accompanying drawings in which:

FIGS. 12-15 are diagrams for explaining a stacked structure of an image sensing device, according to embodiments;

FIG. 16 is an exemplary block diagram of an image sensing device, according to an embodiment;

FIG. 17A is a circuit diagram for explaining a structure of pixels included in a pixel array of FIG. 16, according to an embodiment;

FIGS. 25-28 are diagrams for explaining a stacked structure of an image sensing device, according to embodiments;

DETAILED DESCRIPTION OF THE EMBODIMENTS

Figure 1:
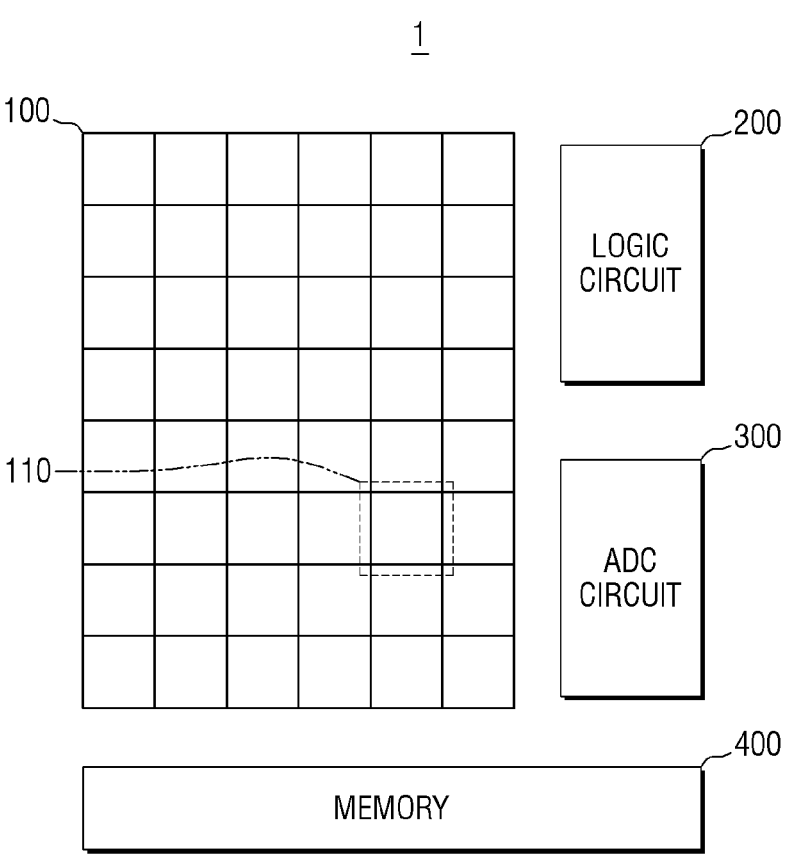
FIG. 1 is an exemplary block diagram of an image sensing device, according to an embodiment.

Hereinafter, embodiments according to the technical idea will be described referring to the accompanying drawings.

As is traditional in the field, embodiments may be described and illustrated in terms of blocks which carry out a described function or functions. These blocks, as shown in the drawings, which may be referred to herein as units or modules or the like, or by names such as converter, processor, controller, sensor, logic, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

FIG. 1 is an exemplary block diagram of an image sensing device according to some embodiments.

An image sensing device 1 may include a pixel array 100, a logic circuit 200, an analog to digital converter (ADC) circuit 300, and a memory 400. The pixel array 100 includes a plurality of pixels 110, the pixels 110 are connected to row lines extending in a first direction and a column line extending along a second direction intersecting the first direction, and may be placed in the form of a matrix. Each of the pixels 110 may include at least one photoelectric element that generates an electric charge in response to light, and a pixel circuit that generates an output voltage by the use of the electric charge generated by the photoelectric element. Although FIG. 1 shows that the pixel array 100 is in the form of a 6×8 matrix, this is an example, the present embodiment is not limited thereto, and the pixel array 100 may include various numbers of pixels.

The logic circuit 200 may include circuits for driving the pixel array. For example, the logic circuit 200 may include a row driver that drives the row lines, a read-out circuit that acquires an output voltage from the pixels 110 through the column lines, a control logic that controls the row driver and the read-out circuit, a power circuit, an input/output interface, an image signal processor, and the like.

The ADC circuit 300 may include a plurality of analog to digital converters. The analog to digital converter may receive an analog-format image signal and convert it into a digital signal. The analog to digital converter may convert the analog signal into the digital signal, using a Correlated Double Sampling (CDS) technique. The ADC circuit 300 may be placed separately from the logic circuit 200, or may have a structure included inside the logic circuit 200.

The memory 400 may include storage elements, and the storage elements may be implemented as at least one of a Metal-Insulator-Metal (MIM) capacitor, a charge trap element, an Magnetic Tunnel Junction (MTJ) element, and a germanium (Ge)-antimony (Sb)-tellurium (Te) (GST) element. The memory 400 may be connected to the pixels 110 and/or the logic circuit 200.

Figure 2:
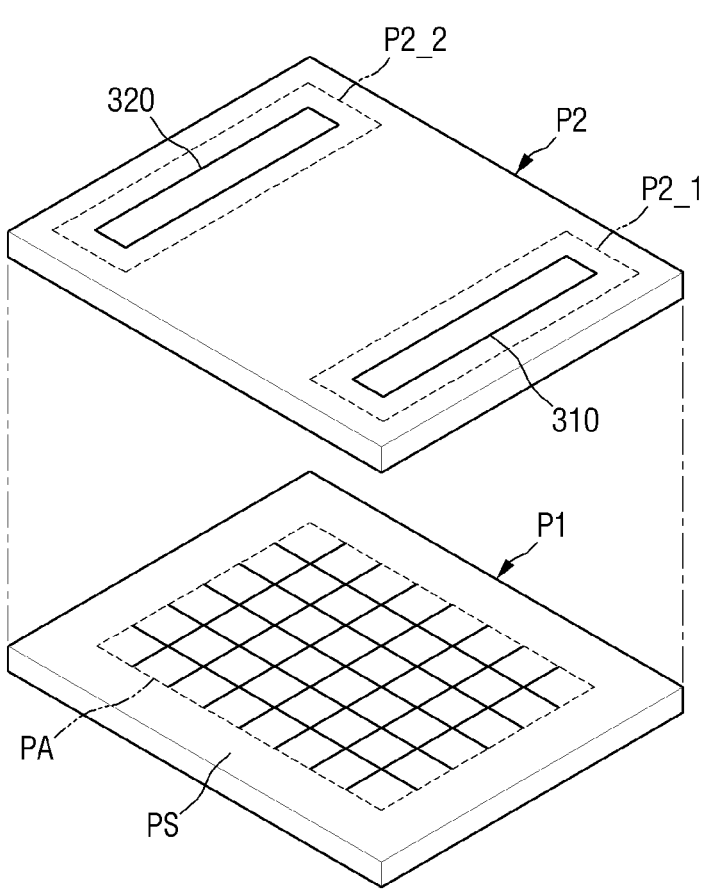
FIG. 2 is a diagram for explaining a stack structure of an image sensing device, according to an embodiment.

FIG. 2 is a diagram for explaining a stack structure of an image sensing device according to some embodiments.

Referring to FIGS. 1 and 2, the image sensing device may be formed as a stacked structure including a first plate P1 and a second plate P2. The second plate P2 may be formed parallel to the first plate P1. Specifically, the second plate P2 may be formed parallel to the first plate P1 on the top of the first plate P1. The first plate may include a pixel array area PA and a pixel periphery area PS. The pixel array 100 may be placed in the pixel array area PA. The logic circuit 200 may be placed in the pixel periphery area PS or may be placed on the second plate P2.

The second plate may include a first area P2_1 and a second area P2_2. The second area P2_2 may be formed to be physically separated from the first area P2_1. In some embodiments, when the ADC circuit 300 shown in FIG. 1 includes a plurality of analog to digital converters, for example first analog to digital converter 310 and second analog to digital converter 320, in embodiments the first analog to digital converter 310 may be placed in the first area P2_1, and the second analog to digital converter 320 may be placed in the second area P2_2.

Figure 3:
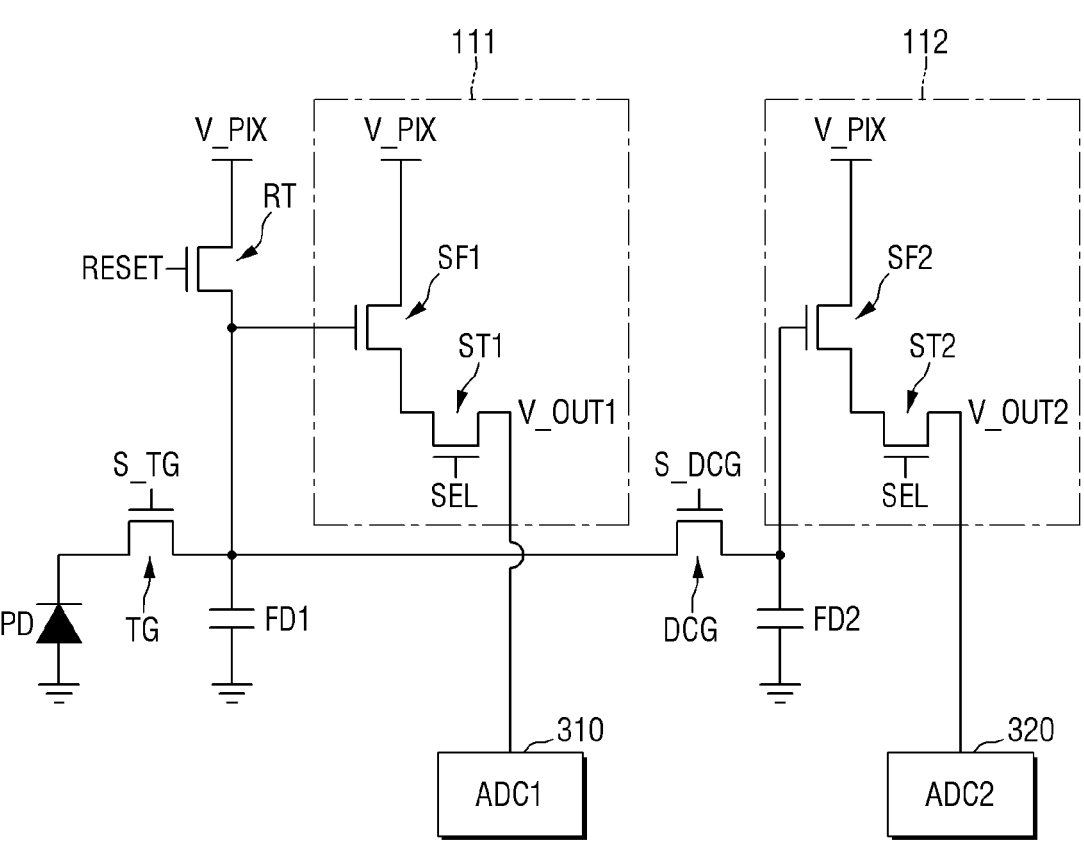
FIG. 3 is a circuit diagram for explaining a structure of pixels included in a pixel array of FIG. 1, according to an embodiment.

FIG. 3 is a circuit diagram for explaining the structure of the pixels included in the pixel array of FIG. 1.

Referring to FIG. 3, the pixel 110 may include a photoelectric element PD, a reset transistor RT that resets the voltage levels of the first and second floating diffusions FD1 and FD2 to a reset level V_RST, a transfer gate TG that transmits the electric charge generated by the photoelectric element PD to the first and second floating diffusions FD1 and FD2, a DCG transistor DCG that connects the first floating diffusion FD1 and the second floating diffusion FD2, a first pixel circuit 111, and a second pixel circuit 112.

The photoelectric element PD may generate an electric charge by sensing an external image, or light, for example light incident on the photoelectric element PD. For example, the photoelectric element PD may include an organic photodiode. When the photoelectric element PD is an organic photodiode, the photoelectric element PD may include first and second electrodes placed to be parallel to each other, and an organic light conversion layer provided between them. The organic light conversion layer may receive light of a predetermined wavelength band and generate the electric charge. Although the photoelectric element PD may be a photodiode, a phototransistor, a photogate, a pinned photodiode or a combination thereof, the embodiments are not limited thereto.

One end of the transfer gate TG may be connected to the photoelectric element PD and the other end thereof may be connected to the first floating diffusion FD1. The transfer gate TG may connect the photoelectric element PD to the first floating diffusion FD1 and the second floating diffusion FD2 on the basis of the transfer gate signal S_TG.

The first pixel circuit 111 may include a first source follower transistor SF1 and a first selection transistor ST1. A gate terminal of the first source follower transistor SF1 is connected to the first floating diffusion FD1, and a pixel voltage V_PIX may be provided to a source terminal thereof. The first source follower transistor SF1 may operate as a source follower buffer amplifier by the electric charge transmitted to the first floating diffusion FD1. That is, the first source follower transistor SF1 may amplify the electric charge generated by the photoelectric element PD and transmitted to the first floating diffusion FD1 by the use of the pixel voltage V_PIX, and may transmit the electric charge to the selection transistor ST1. The first selection transistor ST1 may be controlled by the selection signal SEL provided by the row driver and may perform switching and addressing operations. The source terminal of the first selection transistor ST1 may be connected to the drain terminal of the first source follower transistor SF1, and may output a first output voltage V_OUT1 to a column connected to the first selection transistor ST1. The first output voltage V_OUT1 may be provided to the first analog to digital converter 310.

The second pixel circuit 112 may include a second source follower transistor SF2, and a second selection transistor ST2. A gate terminal of the second source follower transistor SF2 is connected to the second floating diffusion FD2, and a pixel voltage V_PIX may be provided to a source terminal thereof. The second source follower transistor SF2 may operate as a source follower buffer amplifier by the electric charge transmitted to the second floating diffusion FD2. That is, the second source follower transistor SF2 may amplify the electric charge generated by the photoelectric element PD and transmitted to the second floating diffusion FD2 by the use of the pixel voltage V_PIX, and may transmit the electric charge to the second selection transistors ST2. The second selection transistor ST2 may be controlled by the selection signal SEL provided from the row driver and may perform switching and addressing operations. The source terminal of the second selection transistor ST2 may be connected to the drain terminal of the second source follower transistor SF2, and may output a second output voltage V_OUT2 to the column connected to the second selection transistor ST2. The second output voltage V_OUT2 may be provided to the second analog to digital converter 320.

In some embodiments, the first and second floating diffusions FD1 and FD2 may be MIM capacitors, and may be in the form of cylindrical capacitors used in a DRAM cell. Further referring to FIG. 2, when the first and second floating diffusions FD1 and FD2 are in the form of MIM capacitors, they may be formed between the first plate P1 and the second plate P2. When the first and second floating diffusions FD1 and FD2 are in the form of a cylindrical capacitor, they may be formed on a second plate P2.

One end of the DCG transistor DCG may be connected to the first floating diffusion FD1 and the photoelectric element PD, and the other end thereof may be connected to the second floating diffusion FD2. The DCG transistor DCG may adjust an amount of electric charge provided from the photoelectric element PD and/or the first floating diffusion FD1 to the second floating diffusion FD2 on the basis of the DCG control signal S_DCG.

Even though FIG. 3 shows that only the first pixel circuit 111 and second pixel circuit 112 are connected to the single photoelectric element PD, the embodiments are not limited thereto, and a plurality of pixel circuits similar to the first and second pixel circuits 111 and 112 may be further included.

Next, the operation of the pixel 110 circuit of FIG. 3 will be described referring to FIGS. 4 to 10.

Figure 8:
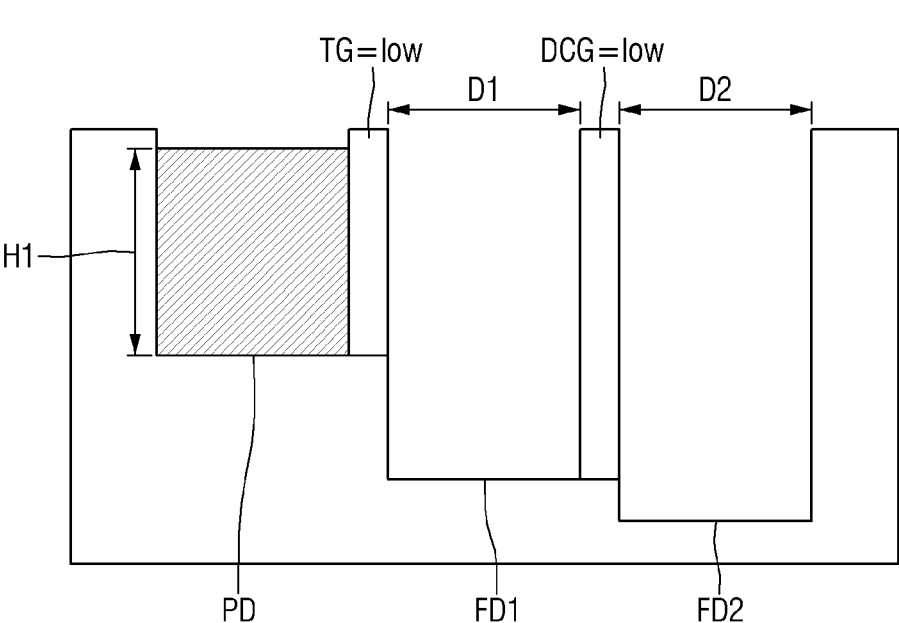
FIGS. 8 to 9 are diagrams for explaining electric charge potentials of a photoelectric element and a first and second floating diffusions, according to embodiments.
Figure 9:
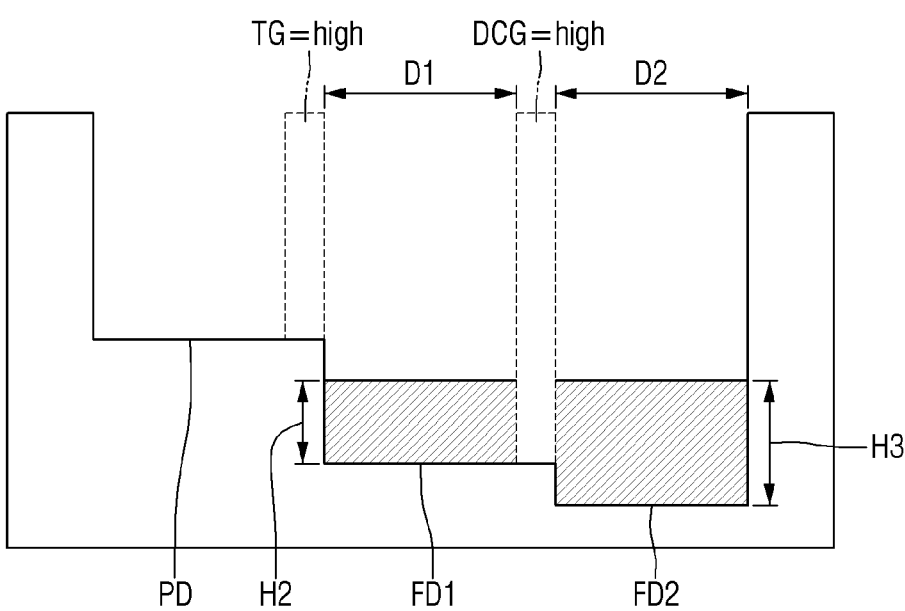
Figure 10:
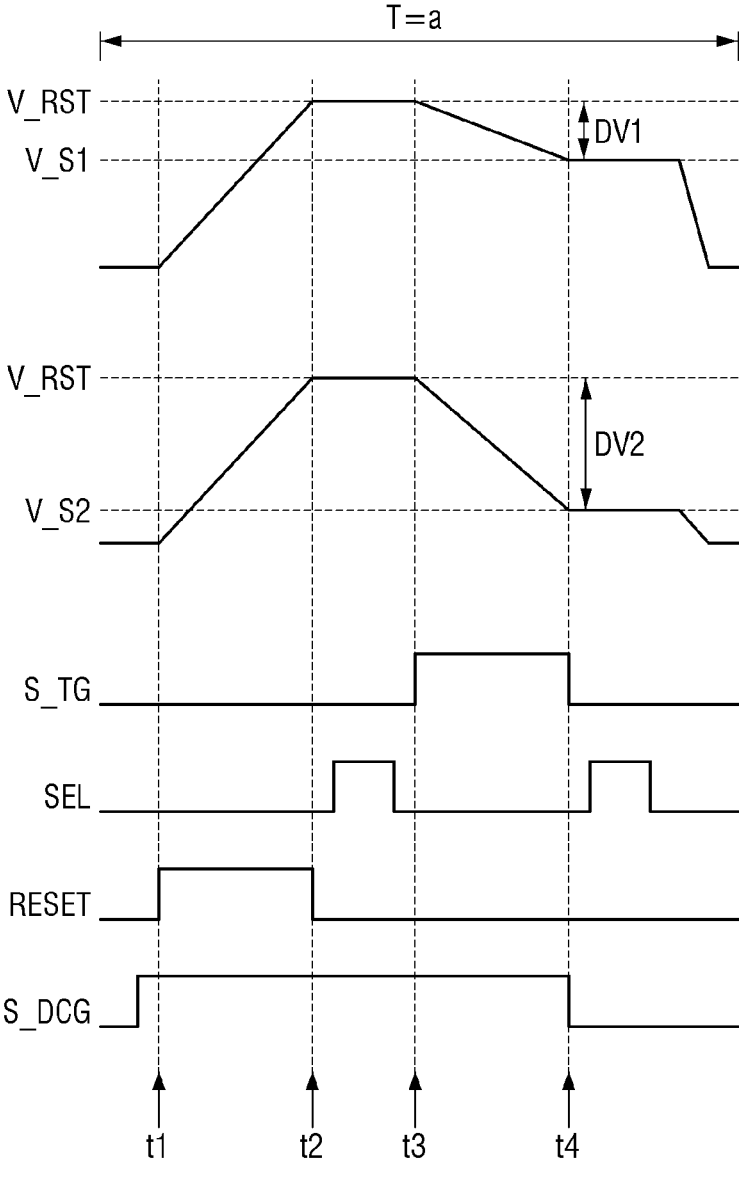
FIG. 10 is a diagram showing changes in waveform of a signal applied to the pixels during a single sensing cycle and an output voltage, according to an embodiment.

FIGS. 4 to 7 are diagrams for explaining the operation of the circuit of FIG. 3. FIGS. 8 to 9 are diagrams for explaining the electric charge potentials of the photoelectric element and the first and second floating diffusions. FIG. 10 is a diagram showing changes in waveform of the signal applied to the pixels during a single sensing cycle and the output voltage.

The operation of the pixel circuit described below is merely an example, and its detailed configuration thereof may be modified as needed.

Figure 4:
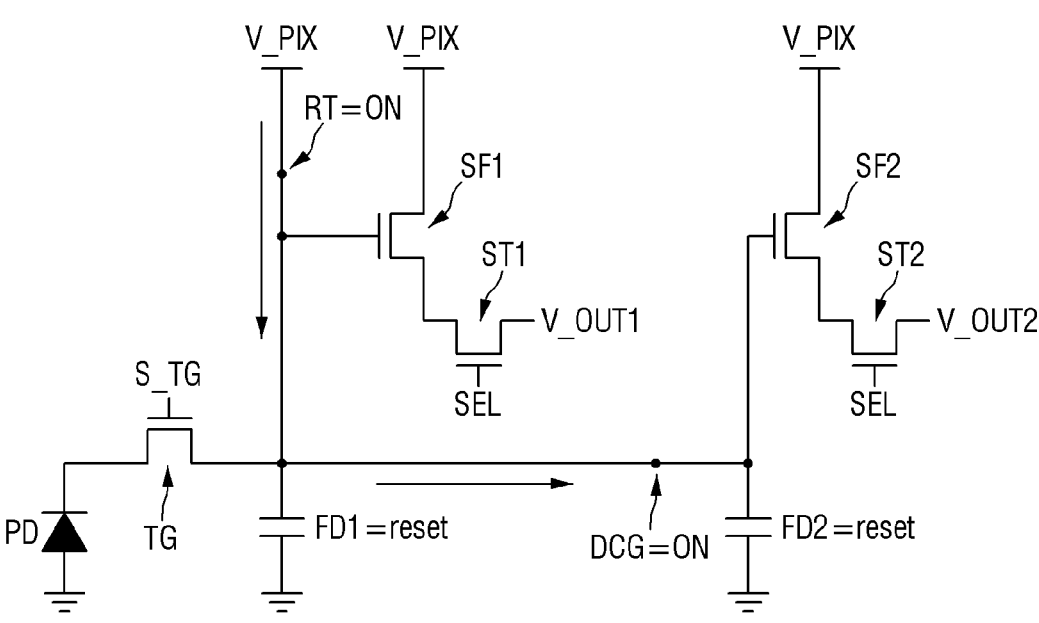
FIGS. 4 to 7 are diagrams for explaining an operation of the circuit of FIG. 3, according to embodiments.

First, referring to FIGS. 4 and 10, before a first time point t1, a DCG control signal S_DCG transitions from a logical low level (hereinafter referred to as a level L) to a logical high level (hereinafter referred to as a level H). That is, the DCG control signal S_DCG may be enabled. The DCG transistor DCG may be turned on accordingly. That is, the first floating diffusion FD1 and the second floating diffusion FD2 may be electrically connected to each other.

At the first time point t1, the reset signal RESET may transition from the level L to the level H. That is, the reset signal RESET may be enabled. The reset transistor RT may be turned on accordingly. However, the DCG control signal S_DCG may maintain the level H as it is. That is, as the DCG control signal S_DCG maintains the level H, the DCG transistor DCG maintains a turn-on state as it is, and thus, it is possible to maintain a state in which the first floating diffusion FD1 and the second floating diffusion FD2 are electrically connected. Therefore, by turning on the reset transistor RT, both the first floating diffusion FD1 and the second floating diffusion FD2 may be reset to the pixel voltage V_PIX.

Figure 5:
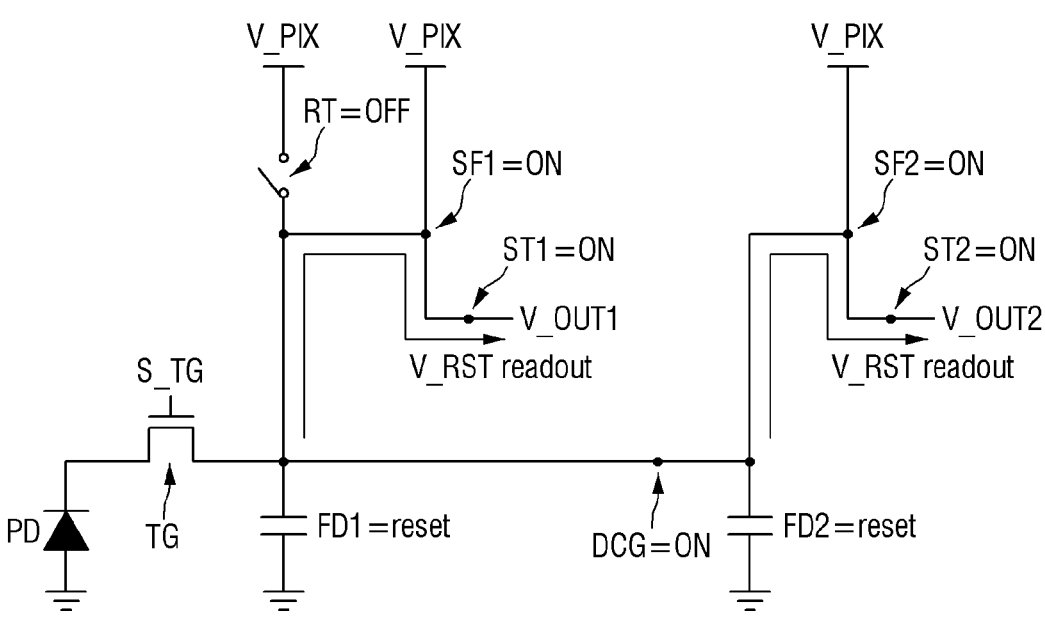

Next, referring to FIGS. 5 and 10, the reset signal RESET may transition from the level H to the level L at a second time point t2. That is, the reset signal RESET may be disabled. The reset transistor RT may be turned off accordingly. However, the DCG control signal S_DCG may maintain the level H as it is. That is, the DCG control signal S_DCG may maintain the enabled state. As the DCG control signal S_DCG maintains the level H, the DCG transistor DCG maintains a turn-on state as it is, and thus, it is possible to maintain a state in which the first floating diffusion FD1 and the second floating diffusion FD2 are electrically connected.

Before the second time point t3 after the reset transistor RT is turned off, the selection signal SEL may transition from level L to level H. That is, the selection signal SEL may be enabled. The first and second selection transistors ST1 and ST2 may be turned on accordingly. The first source follower transistor SF1 may output the electric charge level of the first floating diffusion FD1 to the first output voltage V_OUT1, by the use of the pixel voltage V_PIX. In this case, the first output voltage V_OUT1 may be the reset voltage V_RST. The second source follower transistor SF2 may output the electric charge level of the second floating diffusion FD2 to the second output voltage V_OUT2, by the use of the pixel voltage V_PIX. In this case, because the DCG transistor DCG maintains the turn-on state, the electric charge level of the first floating diffusion FD1 may be the same as the electric charge level of the second floating diffusion FD2. That is, the second output voltage V_OUT2 may also be the reset voltage V_RST.

Figure 6:
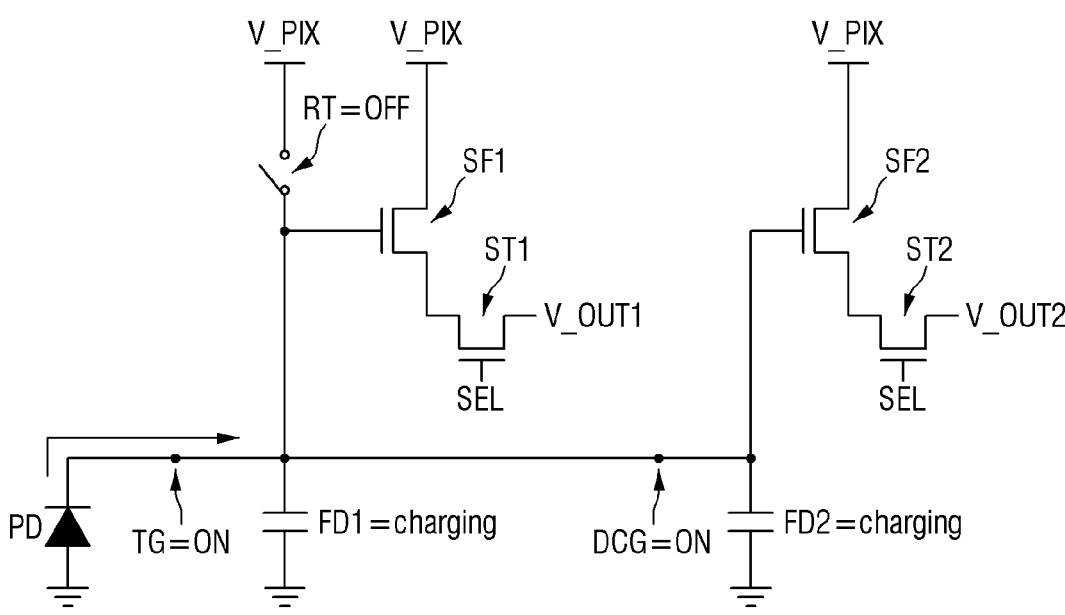

Next, referring to FIGS. 6 and 10, at the third time point t3, the transfer gate signal S_TG may transition from the level L to the level H. That is, the transfer gate signal S_TG may be enabled. The transfer gate TG to be turned on accordingly. However, the DCG control signal S_DCG may maintain the level H as it is. That is, the DCG control signal S_DCG may maintain the enabled state. As the DCG control signal S_DCG maintains the level H, the DCG transistor DCG maintains the turn-on state as it is, and thus, it is possible to maintain a state in which the first floating diffusion FD1 and the second floating diffusion FD2 are electrically connected. Therefore, as the transfer gate TG is turned on, the electric charges stored in the photoelectric element PD may be transmitted to the first floating diffusion FD1 and the second floating diffusion FD2. That is, the electric charge levels of the first floating diffusion FD1 and the second floating diffusion FD2 may increase.

Referring now to FIG. 8, before the third time point t3, the photoelectric element PD may store the electric charge generated by sensing an external image, or for example light. After that, at the third time point t3, the transfer gate control signal S_TG may transition from the level L to the level H, and thus, the electric charge may move from the photoelectric element PD to the first and second floating diffusion FD2 having relatively low electric charge potential. That is, the electric charge level of the photoelectric element PD, illustrated for example as H1 in FIG. 8, may be lowered.

Referring now to FIG. 9, in some embodiments, the first floating diffusion FD1 and the second floating diffusion FD2 may have different capacitances, as described above. Accordingly, the degree to which the electric charge level of the first floating diffusion FD1 rises may differ from the degree to which the electric charge level of the second floating diffusion FD2 rises. In some embodiments, the capacitance of the first floating diffusion FD1 may be smaller than the capacitance of the second floating diffusion FD2. Therefore, a degree to which the electric charge level, illustrated for example as H2, of the first floating diffusion FD1 rises may be smaller than a degree to which the electric charge level, illustrated for example as H3, of the second floating diffusion FD2 rises. Although FIGS. 8 and 9 show that the electric charge level of the photoelectric element PD decreases from H1 to 0 with transition of the transfer gate control signal S_TG from the level L to the level H, this is an example, and the embodiments are not limited thereto.

Figure 7:
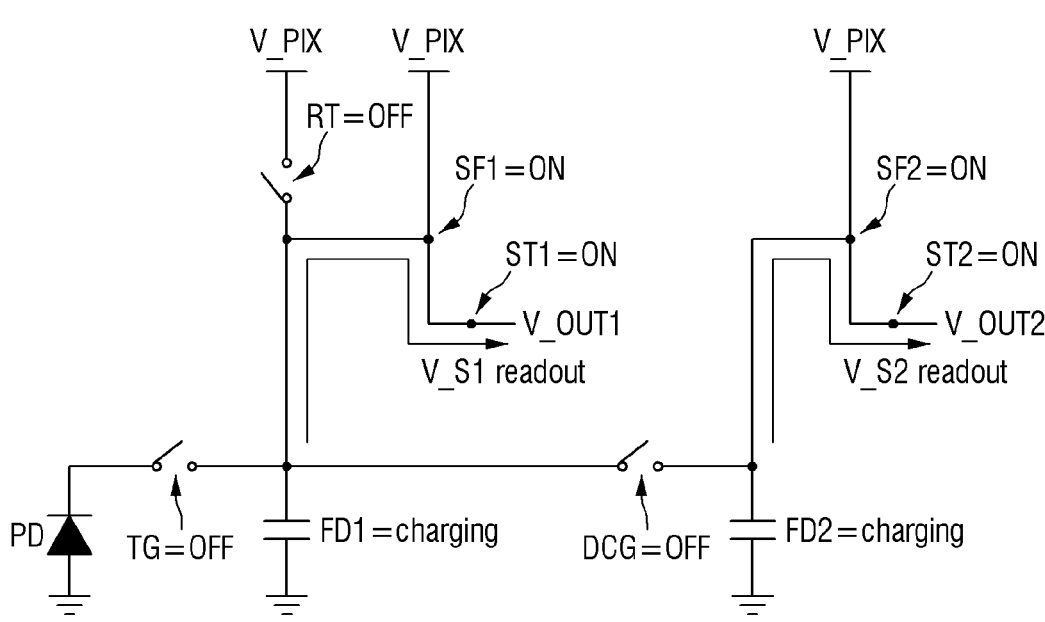

Referring to FIGS. 7 and 10, at a fourth time point t4, the transfer gate signal S_TG may transition from the level H to the level L. That is, the transfer gate signal S_TG may be disabled. The transfer gate TG may be turned off accordingly. Also, at the fourth time point t4, the DCG control signal S_DCG may transition from the level H to the level L. That is, the DCG control signal S_DCG may be disabled. Accordingly, the DCG transistor DCG may be turned off, and the first floating diffusion FD1 and the second floating diffusion FD2 may be electrically separated.

After the fourth time point t4, the selection signal SEL may transition from the level L to the level H. That is, the selection signal SEL may be enabled. The first and second selection transistors ST1 and ST2 may be turned on accordingly. However, the transfer gate signal S_TG and the DCG control signal S_DCG may maintain the level L as it is. That is, the transfer gate signal S_TG and the DCG control signal S_DCG may maintain the disabled state. As the transfer gate signal S_TG and the DCG control signal S_DCG maintain the level L, the transfer gate TG and the DCG transistor DCG may maintain the turn-off state as it is. Accordingly, it is possible to maintain a state in which the photoelectric element PD and the first floating diffusion FD1 are electrically separated from each other, and the first floating diffusion FD1 and the second floating diffusion FD2 are electrically separated from each other.

The first source follower transistor SF1 may output the electric charge level of the first floating diffusion FD1 to the first output voltage V_OUT1, by the use of the pixel voltage V_PIX. In this case, the first output voltage V_OUT1 may be the first signal voltage V_S1. The second source follower transistor SF2 may output the electric charge level of the second floating diffusion FD2 to the second output voltage V_OUT2, by the use of the pixel voltage V_PIX. In this case, because the DCG transistor DCG maintains the turn-off state, the second output voltage V_OUT2 may be different from the first output voltage V_OUT1. Specifically, the second output voltage V_OUT2 may be the second signal voltage V_S2. The first signal voltage V_S1 may have a level higher than the second signal voltage V_S2.

A technique of converting the electric charge of the floating diffusion to the output voltage may differ, depending on a difference in capacitance between the first and second floating diffusions FD1 and FD2 or the electric charge transfer control of the DCG transistor DCG. That is, charge-voltage conversion coefficients of the first pixel circuit 111 and the second pixel circuit 112 may be different from each other. In some embodiments, a technique by which the first pixel circuit 111 generates the first output voltage V_OUT1 may be a high conversion technique, and a technique by which the second pixel circuit 112 generates the second output voltage V_OUT2 may be a low conversion technique.

The first and second output voltages V_OUT1 and V_OUT2 that are output via the aforementioned process are converted into the first and second digital signals through the first analog to digital converter ADC1 and second analog to digital converter ADC2. Each of the analog to digital converters ADC1 and ADC2 compares the reset voltage V_RST with level of each of the signal voltages V_S1 and V_S2 through the CDS technique, and generates a digital signal on the basis of the level difference, illustrated for example as DV1, DV2 in FIG. 10. That is, the first and second digital signals may be generated at the same time.

Next, examples of the effect of embodiments will be described referring to FIG. 11.

Figure 11:
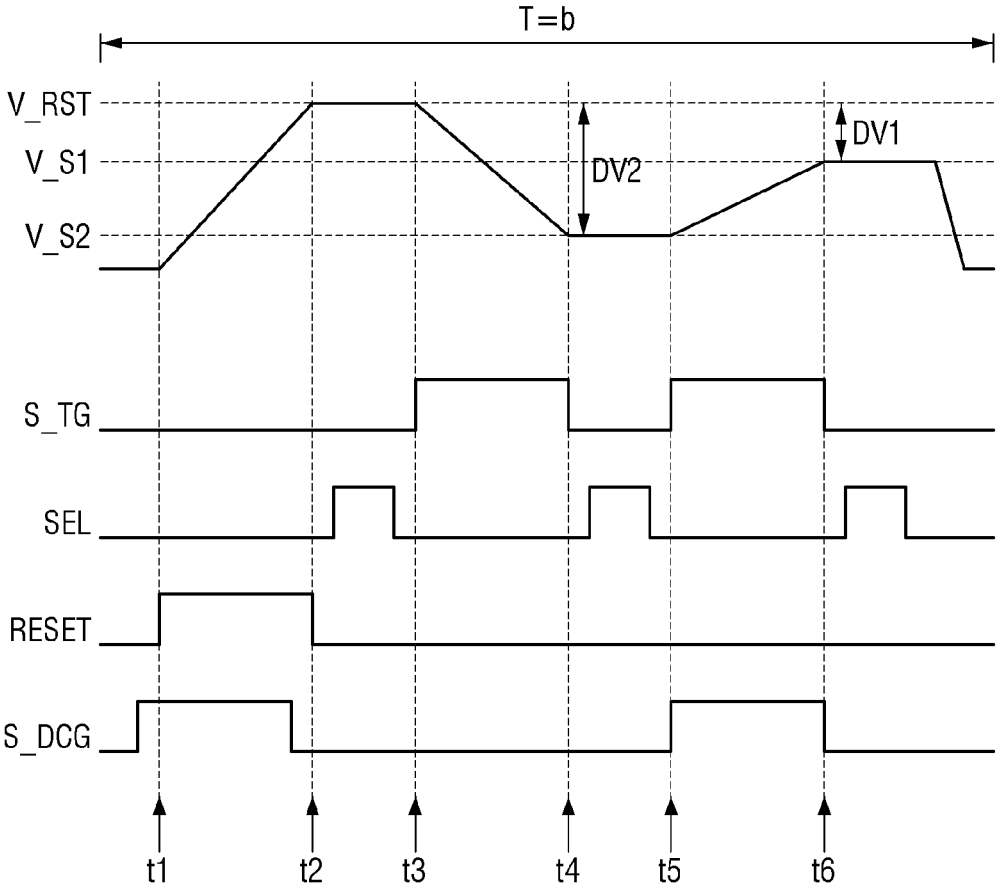
FIG. 11 is a diagram for explaining an operation of a related art pixel circuit, according to an embodiment.

FIG. 11 is a diagram for explaining the operation of a related art pixel circuit unlike some embodiments described above.

Specifically, unlike the example shown in FIG. 3, FIG. 11 is an explanation of an image sensing device that includes first and second floating diffusions connected to a DCG transistor, but includes a single pixel circuit and an analog to digital converter to sense the voltage of each floating diffusion. Referring to FIG. 11, two voltage read processes may be used to generate two different output voltages. That is, as compared with FIG. 10, there is a need to sense the voltage of the first floating diffusion in the state of turning off the DCG transistor between the fourth time point t4 and the fifth time point t5, and then sense the voltages of the first and second floating diffusions in the state of turning on the DCG transistor after the sixth time point t6. Therefore, the first and second digital signals may not be generated at the same time, and as a result, the sensing period T of the image signal increases.

The image sensing device according to the embodiments of the present disclosure may simultaneously read two analog image signals generated by different Conversion Gains (CGs) for implementing an HDR scene. Therefore, the sensing cycle T of the image signal may be shortened as compared with the case of FIG. 11. For example, in embodiments, period T=a of FIG. 10 may be less than period T=b of FIG. 11.

However, when including an additional analog to digital converter in the image sensing device, there may be design issues regarding integration limits. Such a design limitation may be solved by forming the image sensing device using a stacked structure made up of a plurality of plates and by placing an additional analog to digital converter on the plurality of plates, as described referring to FIG. 2.

Figure 12:
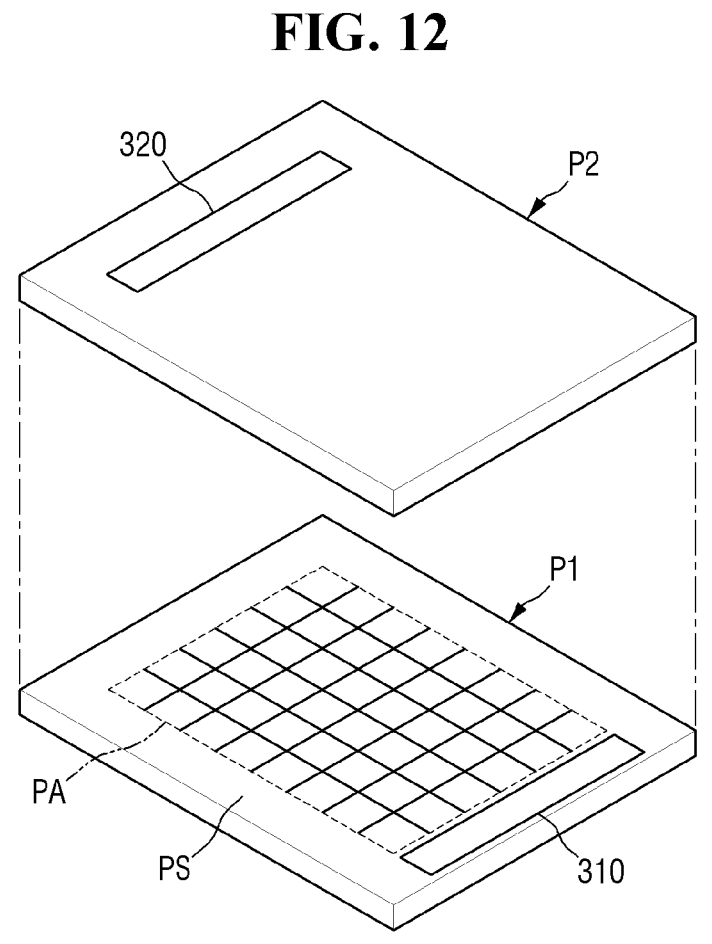

FIG. 12 is a diagram for explaining a stacked structure of an image sensing device according to another embodiment. Hereinafter, differences from FIG. 2 will be mainly explained.

Referring to FIG. 12, the image sensing device may be formed as a stacked structure including a first plate P1 and a second plate P2. The second plate P2 may be formed parallel to the first plate P1. Specifically, the second plate P2 may be formed parallel to the first plate P1 on the top of the first plate P1. The first plate P1 may include a pixel array area PA and a pixel periphery area PS. The pixel array 100 may be placed in the pixel array area PA. A first analog to digital converter 510 may be placed in the pixel periphery area PS. Further, a second analog to digital converter 520 may be placed on the second plate P2.

Figure 13:
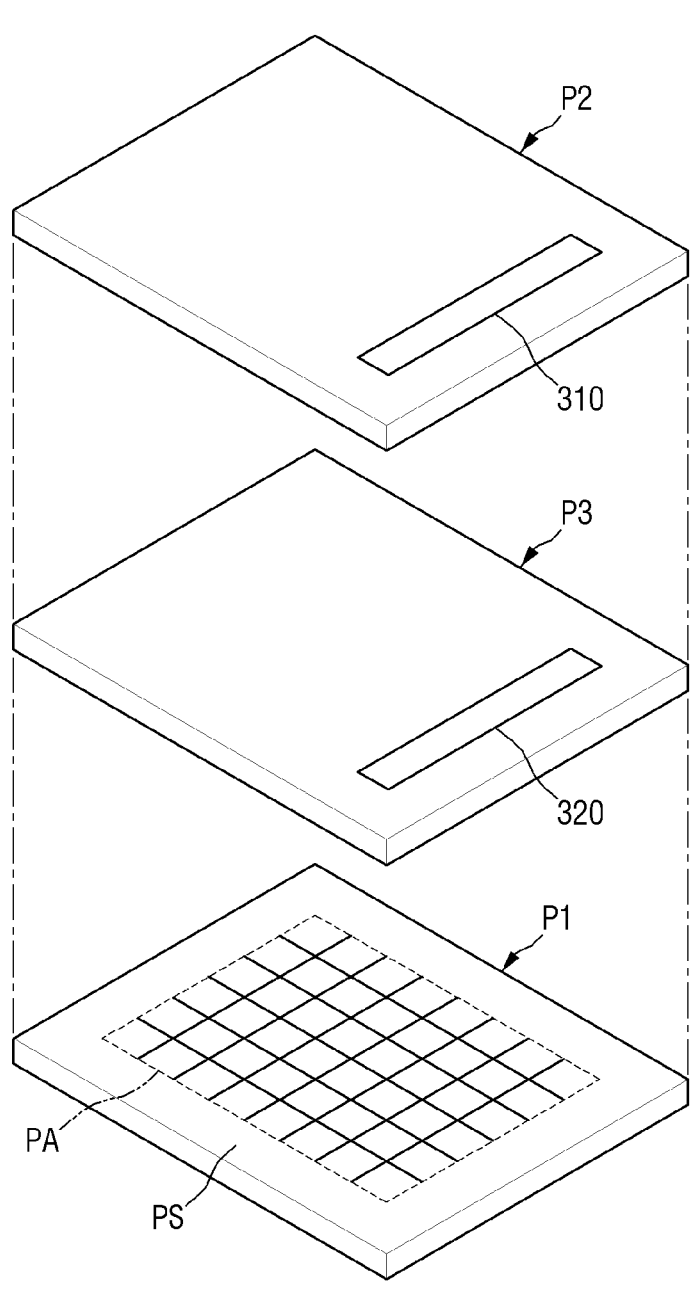

FIG. 13 is a diagram for explaining a stacked structure of an image sensing device according to some other embodiments. Hereinafter, differences from FIG. 2 will be mainly explained.

Referring to FIG. 13, the image sensing device may be formed as a stacked structure including a first plate P1, a second plate P2, and a third plate P3. Each of the plates P1, P2 and P3 may be formed parallel to each other. Specifically, the second plate P2 may be formed on the first plate P1 to be parallel to the first plate P1, and the third plate P3 may be formed between the first plate P1 and the second plate P2 to be parallel to the first and second plates P1 and P2. The first plate P1 may include a pixel array area PA and a pixel periphery area PS. The pixel array 100 may be placed in the pixel array area PA. The first analog to digital converter 510 may be placed on the second plate P2. Further, the second analog to digital converter 520 may be placed on the third plate P3.

Figure 14:
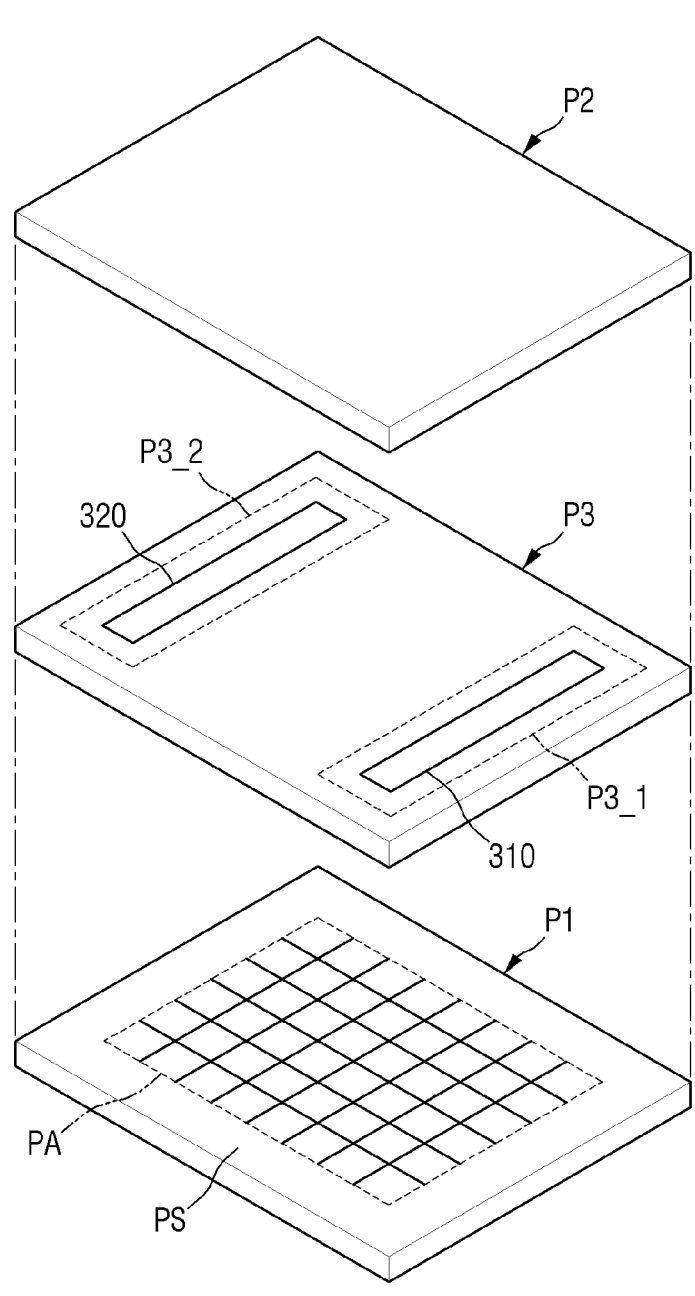

FIG. 14 is a diagram for explaining a stacked structure of an image sensing device according to some other embodiments. Hereinafter, differences from FIG. 2 will be mainly explained.

Referring to FIG. 14, the image sensing device may be formed as a stacked structure including a first plate P1, a second plate P2, and a third plate P3. Each of the plates P1, P2 and P3 may be formed parallel to each other. Specifically, the second plate P2 may be formed on the top of the first plate P1 to be parallel to the first plate P1, and the third plate P3 may be formed between the first plate P1 and the second plate P2 to be parallel to the first and second plates P1 and P2. The third plate P3 may include a first area P3_1 and a second area P3_2. The second area P3_2 may be formed to be physically separated from the first area P3_1. In this case, the first analog to digital converter 510 may be placed in the first area P3_1, and the second analog to digital converter 520 may be placed in the second area P3_2.

Figure 15:
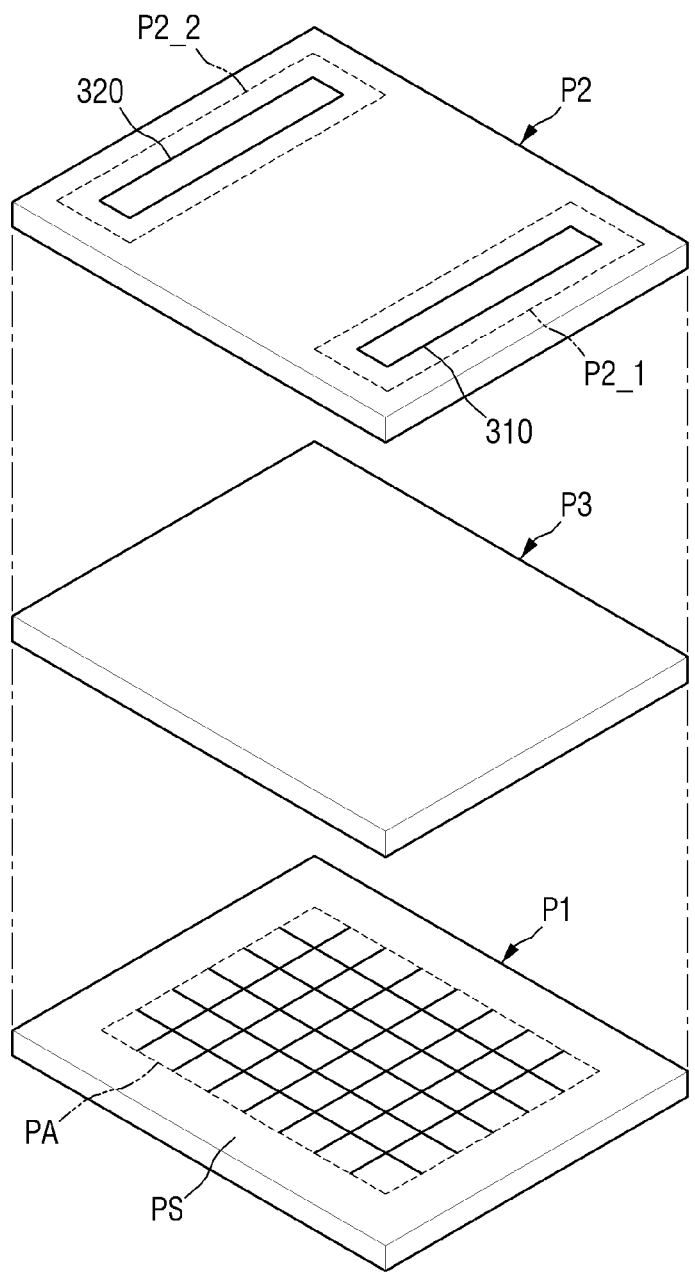

FIG. 15 is a diagram for explaining a stacked structure of an image sensing device according to some other embodiments. Hereinafter, differences from FIG. 14 will be mainly explained.

Referring to FIG. 15, the second plate P2 may include a first area P2_1 and a second area P2_2. The second area P2_2 may be formed to be physically separated from the first area P2_1. In this case, the first analog to digital converter 510 may be placed in the first area P2_1, and the second analog to digital converter 520 may be placed in the second area P2_2.

Figure 16:
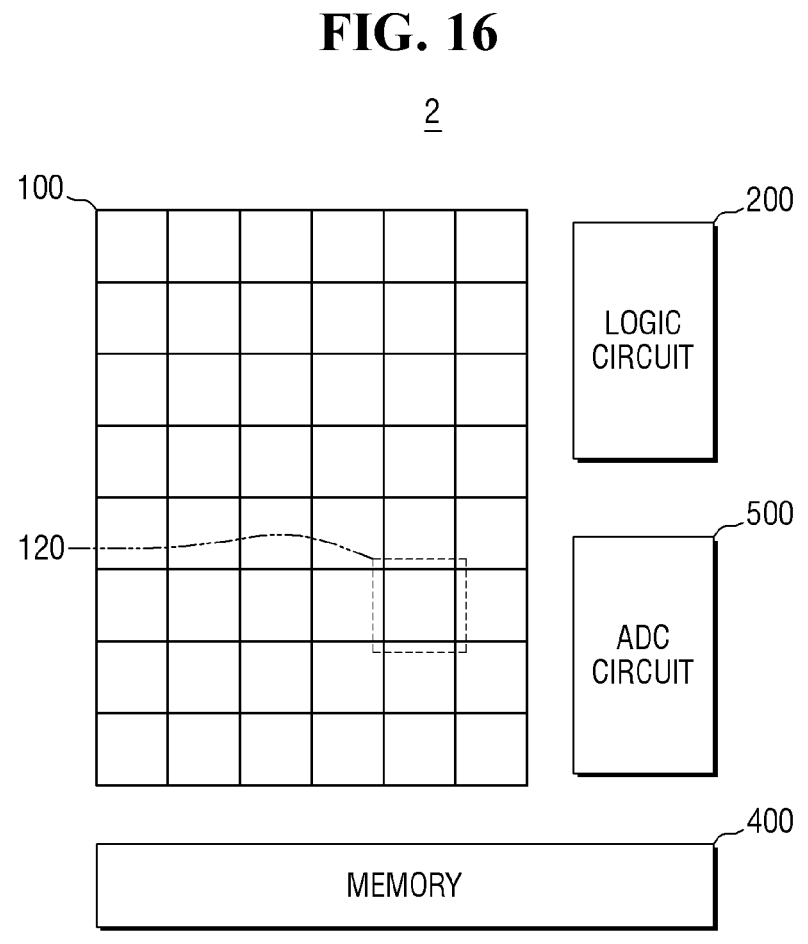

FIG. 16 is an exemplary block diagram of an image sensing device according to some other embodiment. Hereinafter, differences from FIG. 1 will be mainly explained.

Referring to FIG. 16, the image sensing device 2 may include a pixel array 100, a logic circuit 200, an analog to digital converter circuit 500, and a memory 400. The pixel array 100 may include a plurality of pixels 120. The analog to digital converter circuit 500 may include a plurality of analog to digital converters, for example analog to digital converter 510, analog to digital converter 520 and analog to digital converter 530.

Figure 17A:
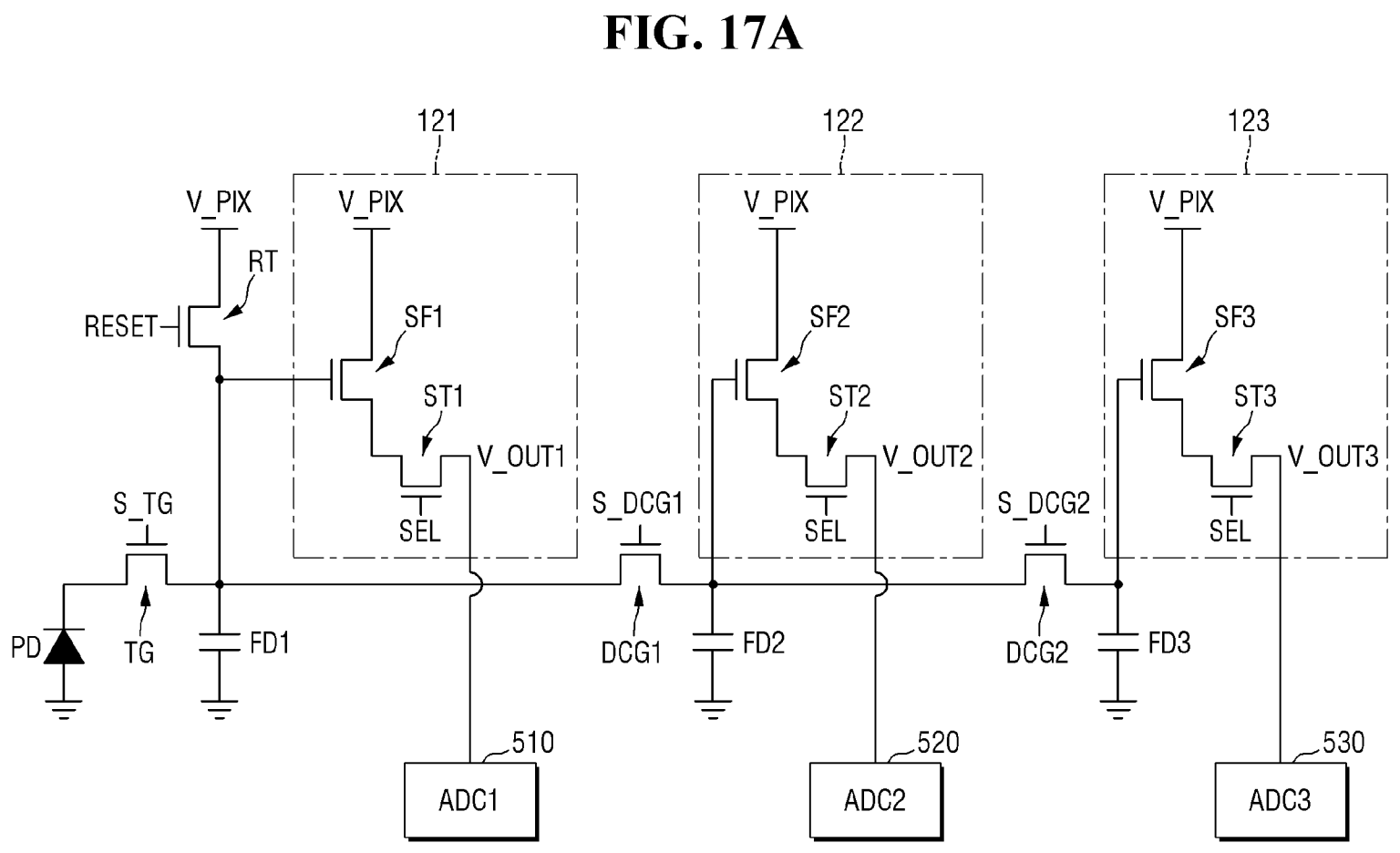
Figure 17B:
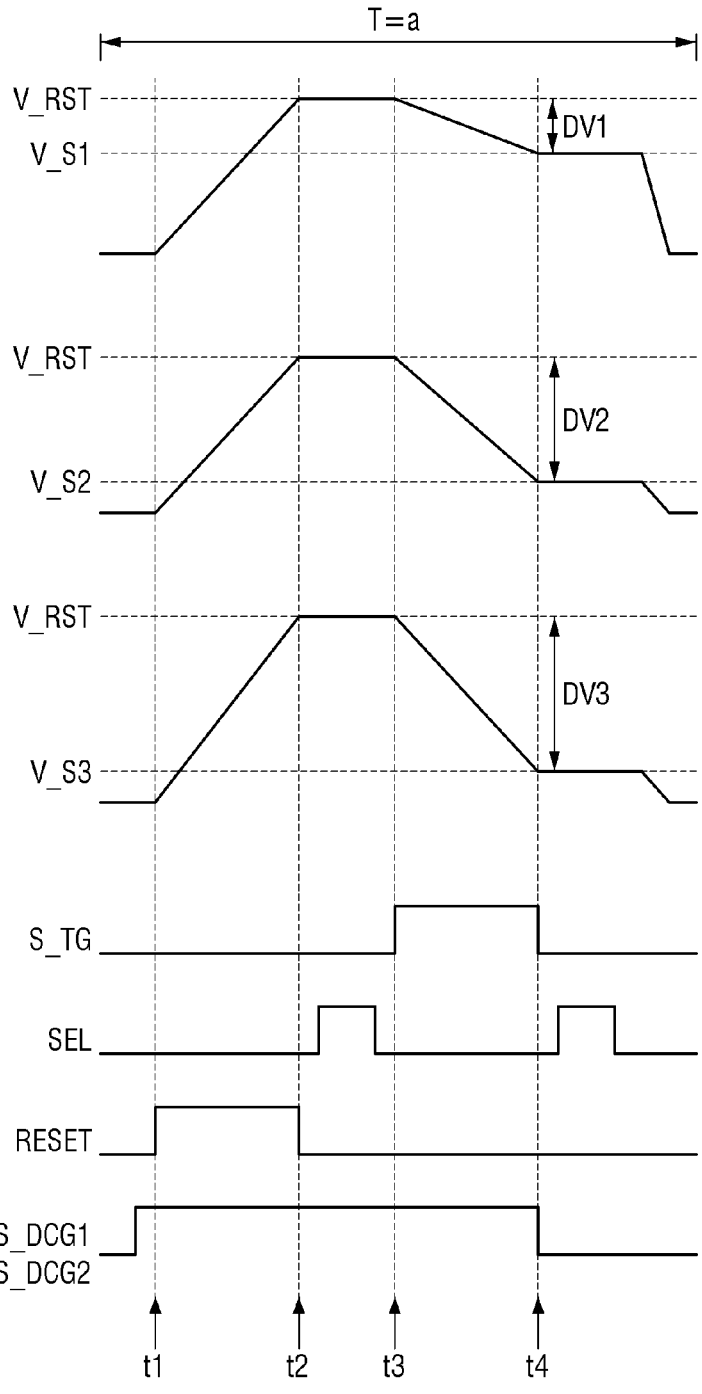
FIG. 17B is a is a diagram showing changes in a waveform of a signal applied to the pixels during a single sensing cycle of FIG. 17A and an output voltage, according to an embodiment

FIG. 17A is a circuit diagram for explaining a structure of the pixels included in the pixel array of FIG. 16, and FIG. 17B is a diagram showing changes in the waveform of the signal applied to the pixels during a single sensing cycle of FIG. 17A and the output voltage. Hereinafter, differences from FIG. 3 will be mainly explained.

Referring to FIG. 17A, the pixel 120 may include a photoelectric element PD, a reset transistor RT that resets the voltage levels of the first to third floating diffusions FD1 and FD2 and FD3 to the reset level V_RST, a transfer gate TG that transmits the electric charge generated by the photoelectric element PD to the first to third floating diffusions FD1, FD2 and FD3, a first DCG transistor DCG1 that connects the first floating diffusion FD1 and the second floating diffusion FD2, a second DCG transistor DCG2 that connects the second floating diffusion FD2 and the third floating diffusion FD3, and first pixel circuit 121, second pixel circuit 122, and third pixel circuit 123. The first pixel circuit 121 and second pixel circuit 122 may be similar to the first pixel circuit 121 and second pixel circuit 112 of FIG. 3, respectively.

One end of the transfer gate TG may be connected to the photoelectric element PD and the other end thereof may be connected to the first floating diffusion FD1. The transfer gate TG may connect the photoelectric element PD and the first to third floating diffusions FD1, FD2 and FD3 on the basis of the transfer gate signal S_TG.

The third pixel circuit 123 may include a third source follower transistor SF3, and a third selection transistor ST3. A gate terminal of the third source follower transistor SF3 is connected to the third floating diffusion FD3, and a pixel voltage V_PIX may be provided to the source terminal. The third source follower transistor SF3 may operate as a source follower buffer amplifier by the electric charge transmitted to the third floating diffusion FD3. That is, the third source follower transistor SF3 may amplify the electric charge generated by the photoelectric element PD and transmitted to the third floating diffusion FD3 by the use of the pixel voltage V_PIX, and may transmit the electric charge to the third selection transistor ST3. The third selection transistor ST3 may be controlled by the selection signal SEL provided from the row driver, and may perform switching and addressing operations. The source terminal of the third selection transistor ST3 may be connected to the drain terminal of the third source follower transistor SF3, and may output a third output voltage V_OUT3 to the column connected to the third selection transistor ST3. The third output voltage V_OUT3 may be provided to the third analog to digital converter 530.

In some embodiments, the first to third floating diffusions FD1, FD2 and FD3 may be MIM capacitors, and may be in the form of cylindrical capacitors used in the DRAM cells. Further referring to FIG. 18, when the first to third floating diffusions FD1, FD2 and FD3 are in the form of MIM capacitors, they may be formed between the second plate P2 and the third plate P3. When the first to third floating diffusions FD1, FD2 and FD3 are in the form of cylindrical capacitors, they may be formed on the second plate P2 or the third plate P3.

One end of the first DCG transistor DCG1 may be connected to the first floating diffusion FD1 and the photoelectric element PD, and the other end thereof may be connected to the second and third floating diffusions FD2 and FD3. The first DCG transistor DCG1 may adjust the amount of electric charge provided from the photoelectric element PD and/or the first floating diffusion FD1 to the second and third floating diffusion FD2 and FD3 on the basis of the first DCG control signal S_DCG1.

One end of the second DCG transistor DCG2 may be connected to the first and second floating diffusions FD1 and FD2 and the photoelectric element PD, and the other end thereof may be connected to the third floating diffusion FD3. The second DCG transistor DCG2 may adjust the amount of electric charge provided from the photoelectric element PD and/or the first and second floating diffusions FD1 and FD2 to the third floating diffusion FD3 on the basis of the second DCG control signal S_DCG2.

Even though FIG. 17A shows that only the first to third pixel circuits 121, 122 and 123 are connected to the single photoelectric device PD, the embodiment is not limited thereto, and a plurality of pixel circuits similar to the first to third pixel circuits 121, 122 and 123 may be further included.

Next, the operation of the pixel circuit shown in FIG. 17A will be described referring to FIG. 17B. The operation of the pixel circuit shown in FIG. 17A may be similar to embodiments discussed above with respect to FIGS. 4 to 10.

Referring to FIG. 17B, first, before the first time point t1, the first and second DCG control signals S_DCG1 and S_DCG2 transition from the level L to the level H. That is, the first and second DCG control signals S_DCG1 and S_DCG2 may be enabled. The first and second DCG transistors DCG1 and DCG2 may be turned on accordingly. That is, the first floating diffusion FD1 and the second floating diffusion FD2 may be electrically connected, and the second floating diffusion FD2 and the third floating diffusion FD3 may be electrically connected.

At the first time point t1, the reset signal RESET may transition from the level L to the level H. That is, the reset signal RESET may be enabled. The reset transistor RT may be turned on accordingly. However, the first and second DCG control signals S_DCG1 and S_DCG2 may maintain the level H as it is. That is, the first and second DCG control signals S_DCG1 and S_DCG2 may maintain the enabled state. As the first and second DCG control signals S_DCG1 and S_DCG2 maintain the level H, and the first and second DCG transistors DCG1 and DCG2 maintain the turn-on state as it is, and thus, it is possible to maintain a state in which the first to third floating diffusions FD1, FD2 and FD3 are electrically connected. Therefore, as the reset transistor RT is turned on, the first to third floating diffusions FD1, FD2 and FD3 may be all reset to the pixel voltage V_PIX.

Next, at the second time point t2, the reset signal RESET may transition from the level H to the level L. That is, the reset signal RESET may be disabled. The reset transistor RT may be turned off accordingly. However, the first and second DCG control signals S_DCG1 and S_DCG2 may maintain the level H as it is. That is, the first and second DCG control signals S_DCG1 and S_DCG2 may maintain the enabled state. As the first and second DCG control signals S_DCG1 and S_DCG2 maintain the level H, the first and second DCG transistors DCG1 and DCG2 maintain the turn-on state as it is, and thus, it is possible to maintain a state in which the first to third floating diffusions FD1, FD2 and FD3 are electrically connected.

After the reset transistor RT is turned off and before the third time point t3, the selection signal SEL may transition from the level L to the level H. That is, the selection signal SEL may be enabled. The first to third selection transistors ST1, ST2 and ST3 may be turned on accordingly. The first source follower transistor SF1 may output the electric charge level of the first floating diffusion FD1 to the first output voltage V_OUT1, by the use of the pixel voltage V_PIX. In this case, the first output voltage V_OUT1 may be the reset voltage V_RST. The second and third source follower transistors SF2 and SF3 may output the electric charge levels of the second and third floating diffusions FD2 and FD3 to the second and third output voltage V_OUT2 and V_OUT3, by the use of the pixel voltage V_PIX. In this case, because the first and second DCG transistors DCG1 and DCG2 maintain the turn-on state, the electric charge levels of the first to third floating diffusions FD1, FD2 and FD3 may be all the same. That is, the second and third output voltages V_OUT2 and V_OUT3 may also be the reset voltage V_RST.

Next, at the third time point t3, the transfer gate signal S_TG may transition from the level L to the level H. That is, the transfer gate signal S_TG may be enabled. The transfer gate TG may be turned on accordingly. However, the first and second DCG control signals S_DCG1 and S_DCG2 may maintain the level H as it is. That is, the first and second DCG control signals S_DCG1 and S_DCG2 may maintain the enabled state. As the first and second DCG control signals S_DCG1 and S_DCG2 maintain the level H, the first and second DCG transistors DCG1 and DCG2 maintain the turn-on state as it is, and thus, it is possible to maintain a state in which the first to third floating diffusions FD1, FD2 and FD3 are electrically connected. Therefore, as the transfer gate TG is turned on, the electric charges stored in the photoelectric element PD may be transmitted to the first to third floating diffusions FD1, FD2 and FD3. That is, the electric charge levels of each of the floating diffusions FD1, FD2 and FD3 may increase.

Before the third time point t3, the photoelectric element PD may store the electric charge generated by sensing an external image, or for example light. After that, at the third time point t3, the transfer gate control signal S_TG may transition from the level L to the level H, and thus, the electric charge may move from the photoelectric element PD to the first to third floating diffusion FD1, FD2 and FD3 having relatively low electric charge potential. That is, the electric charge level of the photoelectric element PD may be lowered.

Because the first to third floating diffusions FD1, FD2 and FD3 may have different capacitances, the degrees to which the electric charge level of the floating diffusions FD1, FD2 and FD3 rise may be different from each other.

At the fourth time point t4, the transfer gate signal S_TG may transition from the level H to the level L. That is, the transfer gate signal S_TG may be disabled. The transfer gate TG may be turned off accordingly. Further, at the fourth time point t4, the first and second DCG control signals S_DCG1 and S_DCG2 may transition from the level H to the level L. That is, the first and second DCG control signals S_DCG1 and S_DCG2 may be disabled. Accordingly, the first and second DCG transistors DCG1 and DCG2 may be turned off, and the first to third floating diffusions may be electrically separated from each other.

After the fourth time point t4, the selection signal SEL may transition from the level L to the level H. That is, the selection signal SEL may be enabled. The first to third selection transistors ST1, ST2 and ST3 may be turned on accordingly. However, the transfer gate signal S_TG and the first and second DCG control signals S_DCG1 and S_DCG2 may maintain the level L as it is. That is, the transfer gate signal S_TG and the first and second DCG control signals S_DCG1 and S_DCG2 may maintain the disabled state. As the transfer gate signal S_TG and the first and second DCG control signals S_DCG1 and S_DCG2 maintain the level L, the transfer gate TG and the first and second DCG transistors DCG1 and DCG2 may maintain the turn-off state as it is. As a result, it is possible to maintain a state in which the photoelectric element PD and the first to third floating diffusions FD1, FD2 and FD3 are electrically separated from each other.

The first source follower transistor SF1 may output the electric charge level of the first floating diffusion FD1 to the first output voltage V_OUT1, by the use of the pixel voltage V_PIX. In this case, the first output voltage V_OUT1 may be the first signal voltage V_S1. The second source follower transistor SF2 may output the electric charge level of the second floating diffusion FD2 to the second output voltage V_OUT2, by the use of the pixel voltage V_PIX. The third source follower transistor SF3 may output the electric charge level of the third floating diffusion FD3 to the third output voltage V_OUT3, by the use of the pixel voltage V_PIX. In this case, since the first and second DCG transistors DCG1 and DCG2 maintain the turn-off state, the respective output voltages V_OUT1, V_OUT2 and V_OUT3 may be different from each other, depending on the difference in capacitances of each of the floating diffusions FD1, FD2 and FD3 or the electric charge transfer control of the first and second DCG transistors DCG1 and DCG2. That is, the technique of converting the electric charge of the floating diffusion into the output voltage may be different for each pixel circuit. In some embodiments, the technique by which the first pixel circuit 121 generates the first output voltage V_OUT1 may be a high conversion technique, and the type by which the second pixel circuit 122 generates the second output voltage V_OUT2 may be a low conversion technique. The technique by which the third pixel circuit 123 generates the third output voltage V_OUT3 may be another technique.

The first to third output voltages V_OUT1, V_OUT2 and V_OUT3 that are output via the aforementioned processes are converted into the first to third digital signals through the first to third analog to digital converters ADC1, ADC2 and ADC3. Each of the analog to digital converters ADC1, ADC2 and ADC3 compares the level of the reset voltage V_RST with each of the signal voltages V_S1, V_S2 and V_S3 through the CDS technique, and generates a digital signal on the basis of the level difference, illustrated for example as DV1, DV2 and DV3 in FIG. 17B. That is, by electrically separating the first to third floating diffusions FD1, FD2 and FD3 from each other, and by simultaneously sensing the voltages of the respective floating diffusions using the first to third pixel circuits 121, 122 and 123, different output voltages V_OUT1, V_OUT2 and V_OUT3 may be output at the same time.

Figure 18:
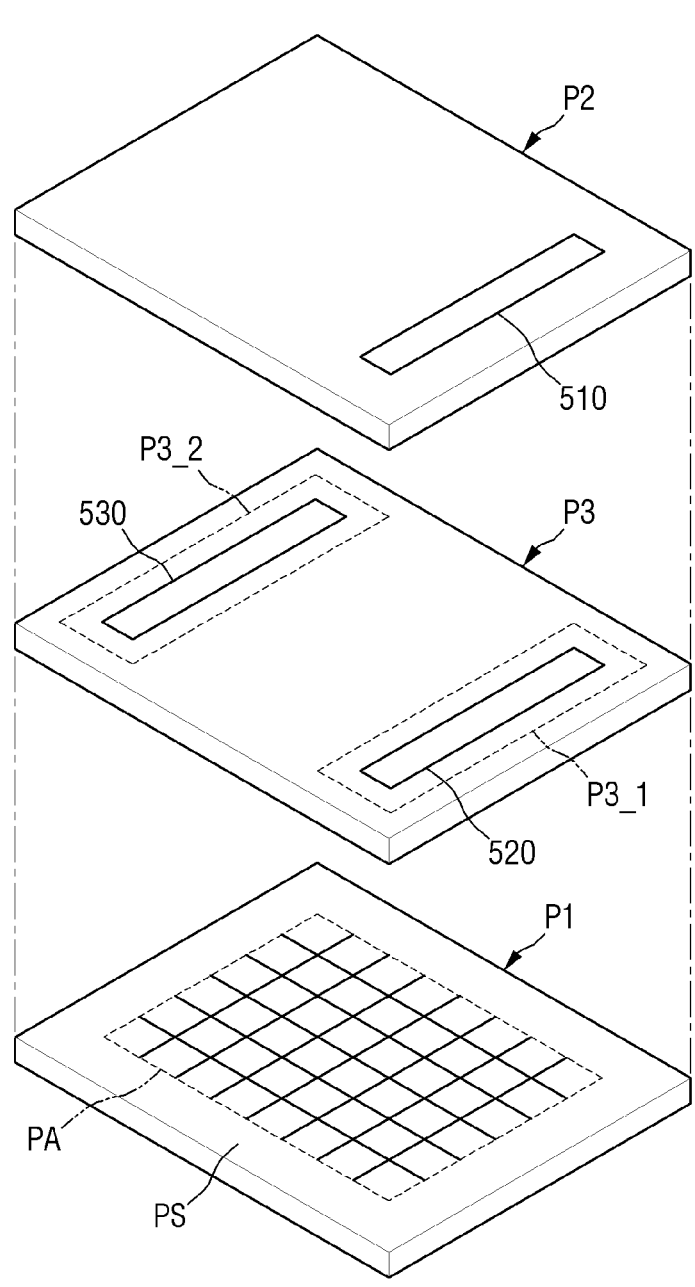
FIGS. 18-22 are diagrams for explaining a stacked structure of an image sensing device, according to embodiments.

FIG. 18 is a diagram for explaining a stacked structure of the image sensing device shown in FIG. 17A.

Referring to FIG. 18, the image sensing device may be formed as a stacked structure including a first plate P1, a second plate P2, and a third plate P3. Each of the plates P1, P2 and P3 may be formed parallel to each other. Specifically, the second plate P2 may be formed on the top of the first plate P1 to be parallel to the first plate P1, and the third plate P3 may be formed between the first plate P1 and the second plate P2 to be parallel to the first and second plates P1 and P2. The first plate P1 may include a pixel array area PA and a pixel periphery area PS. The pixel array 100 may be placed in the pixel array area PA. The logic circuit 200 may be placed in the pixel periphery area PS or may be placed in the second plate P2 or the third plate P3. The first analog to digital converter 510 may be placed on the second plate P2. Further, the second and third analog to digital converters 520 and 530 may be placed on the third plate P3.

The third plate P3 may include a first area P3_1 and a second area P3_2. The second area P3_2 may be formed to be physically separated from the first area P3_1. In this case, the second analog to digital converter 520 may be placed in the first area P3_1, and the third analog to digital converter 530 may be placed in the second area P3_2.

Figure 19:
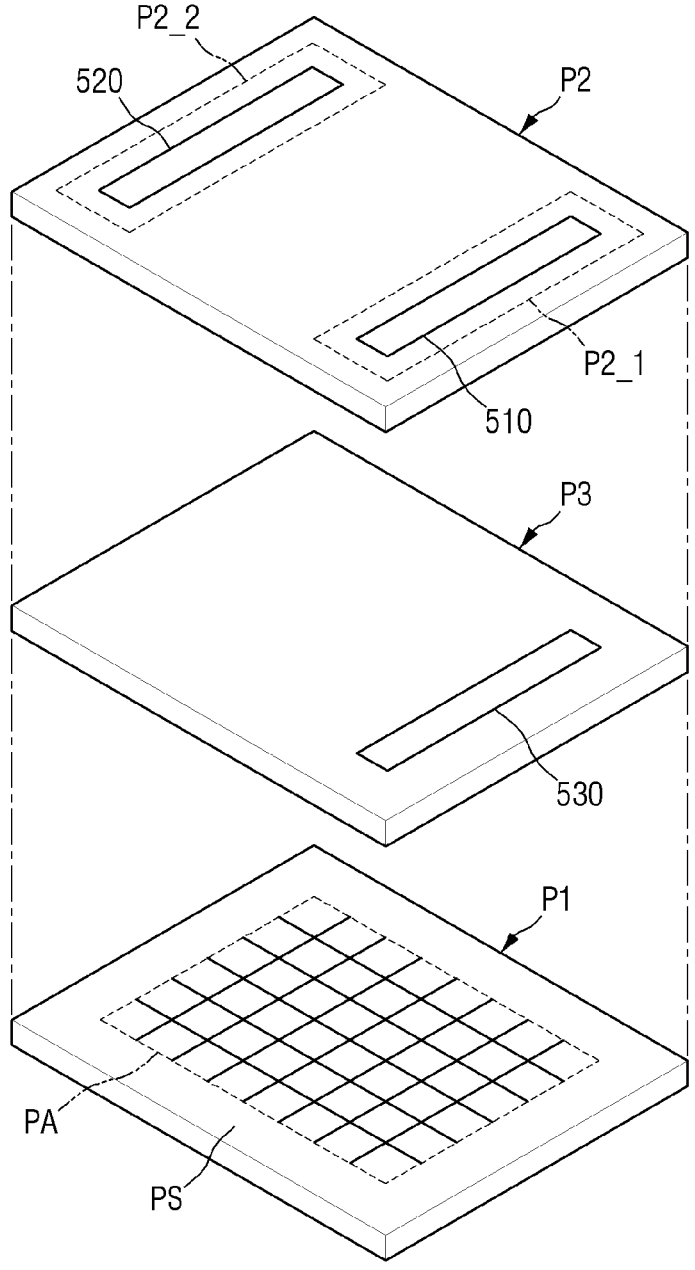

FIG. 19 is a diagram for explaining a stacked structure of an image sensing device according to some other embodiments. Hereinafter, differences from FIG. 18 will be mainly explained.

Referring to FIG. 19, the second plate P2 may include a first area P2_1 and a second area P2_2. The second area P2_2 may be formed to be physically separated from the first area P2_1. In this case, the first analog to digital converter 510 may be placed in the first area P2_1, and the second analog to digital converter 520 may be placed in the second area P2_2. The third analog to digital converter 530 may be placed on the third plate P3.

Figure 20:
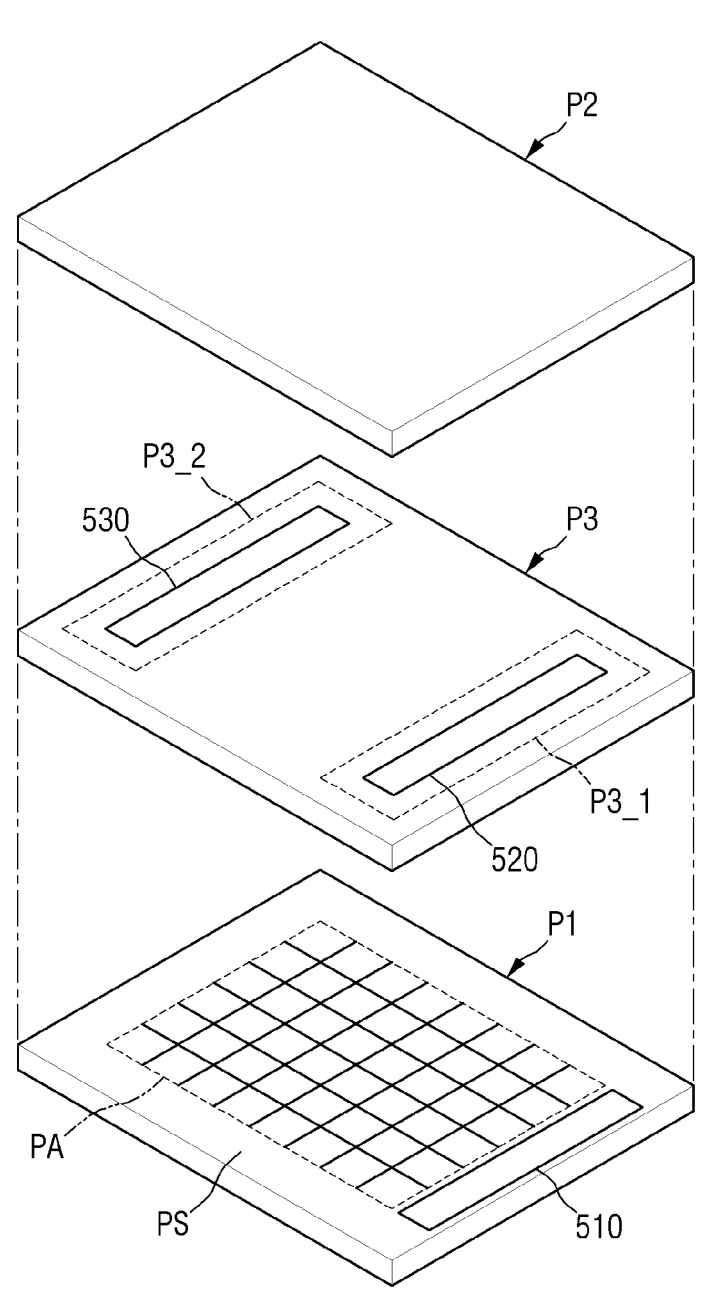

FIG. 20 is a diagram for explaining a stacked structure of an image sensing device according to some other embodiments. Hereinafter, differences from FIG. 18 will be mainly explained.

The first analog to digital converter 510 may be placed in the pixel periphery area PS of the first plate P1. The logic circuit 200 may be placed in the pixel periphery area PS or in the second plate P2.

Figure 21:
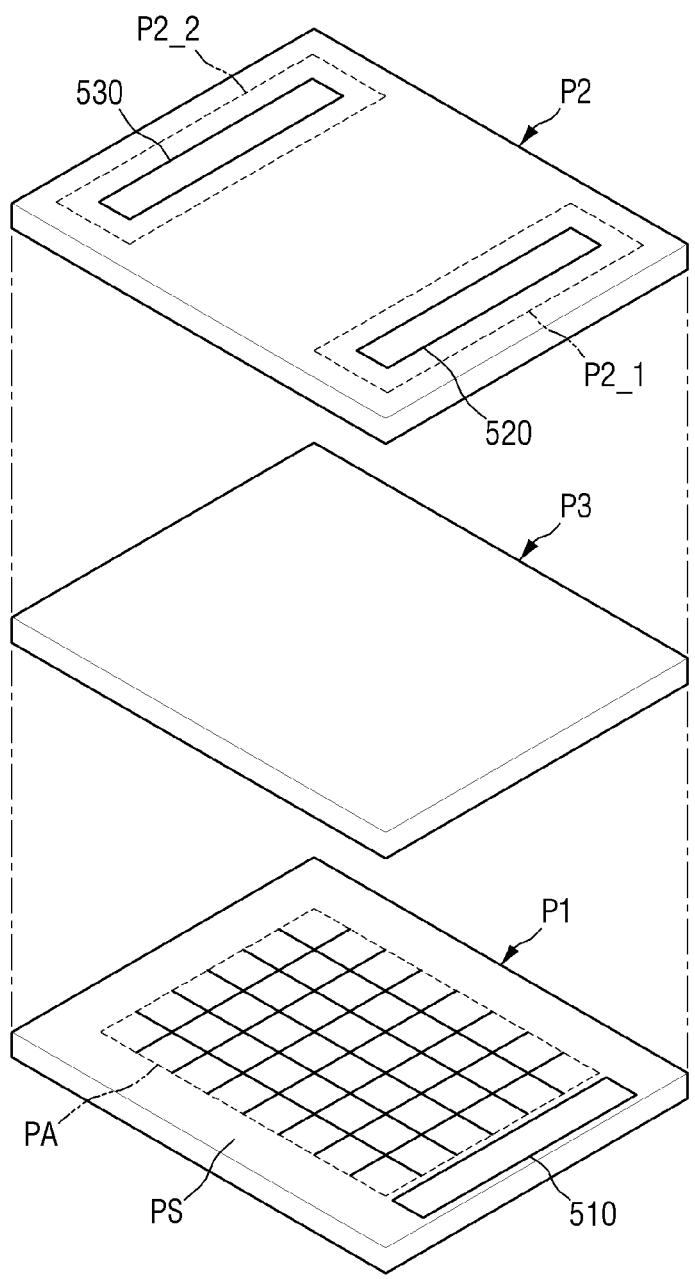

FIG. 21 is a diagram for explaining a stacked structure of an image sensing device according to some other embodiments. Hereinafter, differences from FIG. 19 will be mainly explained.

The first analog to digital converter 510 may be placed in the pixel periphery area PS of the first plate P1. The logic circuit 200 may be placed in the pixel periphery area PS or in the third plate P3.

Figure 22:
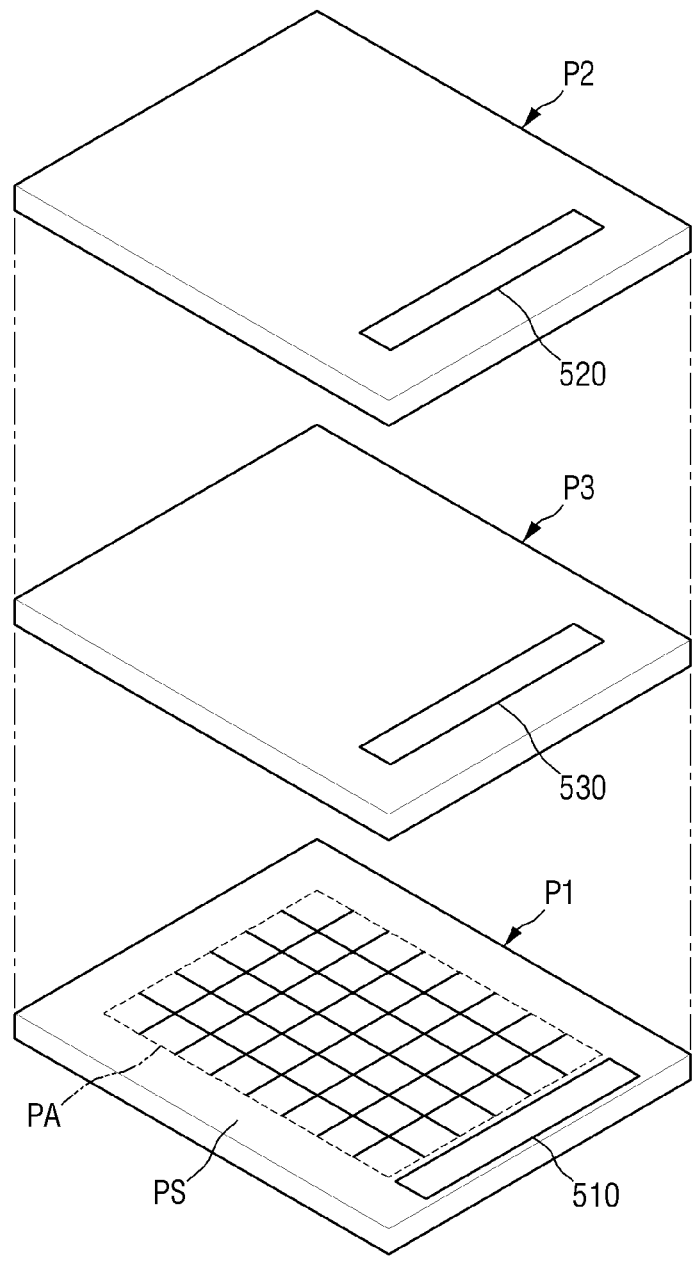

FIG. 22 is a diagram for explaining a stacked structure of an image sensing device according to some other embodiments. Hereinafter, differences from FIG. 19 will be mainly explained.

The first analog to digital converter 510 may be placed in the pixel periphery area PS of the first plate P1. The second analog to digital converter 520 may be placed on the second plate P2. The third analog to digital converter 530 may be placed on the third plate P3. The logic circuit 200 may be placed in the pixel periphery area PS and may be placed in the second plate P2 or the third plate P3.

Figure 23:
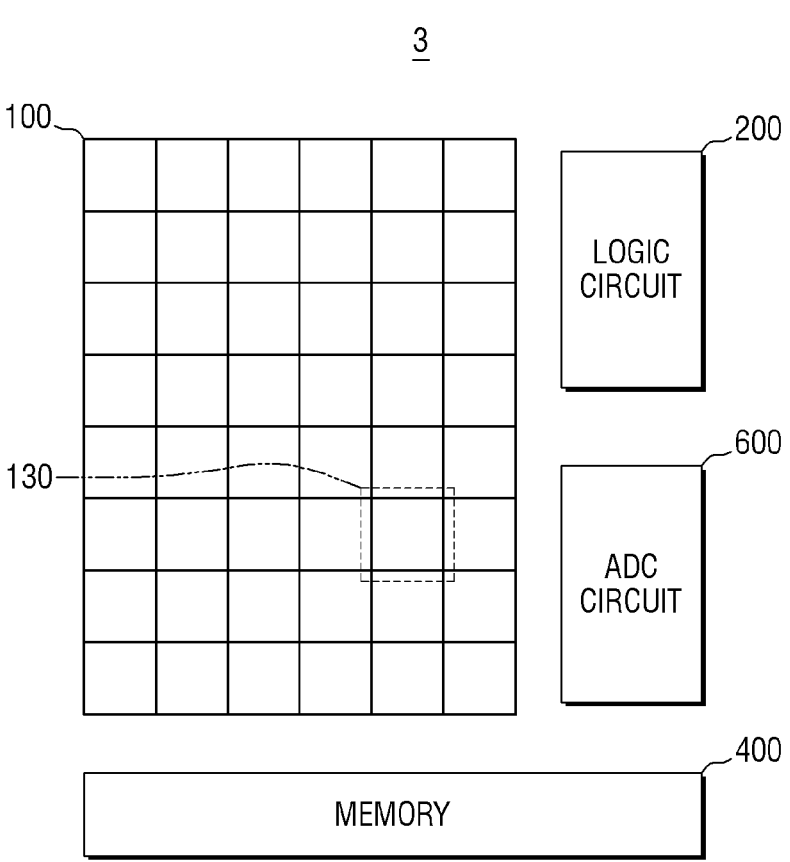
FIG. 23 is an exemplary block diagram of an image sensing device, according to an embodiment.

FIG. 23 is an exemplary block diagram of an image sensing device according to some other embodiment. Hereinafter, differences from FIG. 1 will be mainly explained.

Referring to FIG. 23, the image sensing device may include a pixel array 100, a logic circuit 200, an analog to digital converter circuit 600, and a memory 400. The pixel array 100 may include a plurality of pixels 130. The analog to digital converter circuit 600 may include a plurality of analog to digital converters, for example analog to digital converter 610 and analog to digital converter 620.

Figure 24:
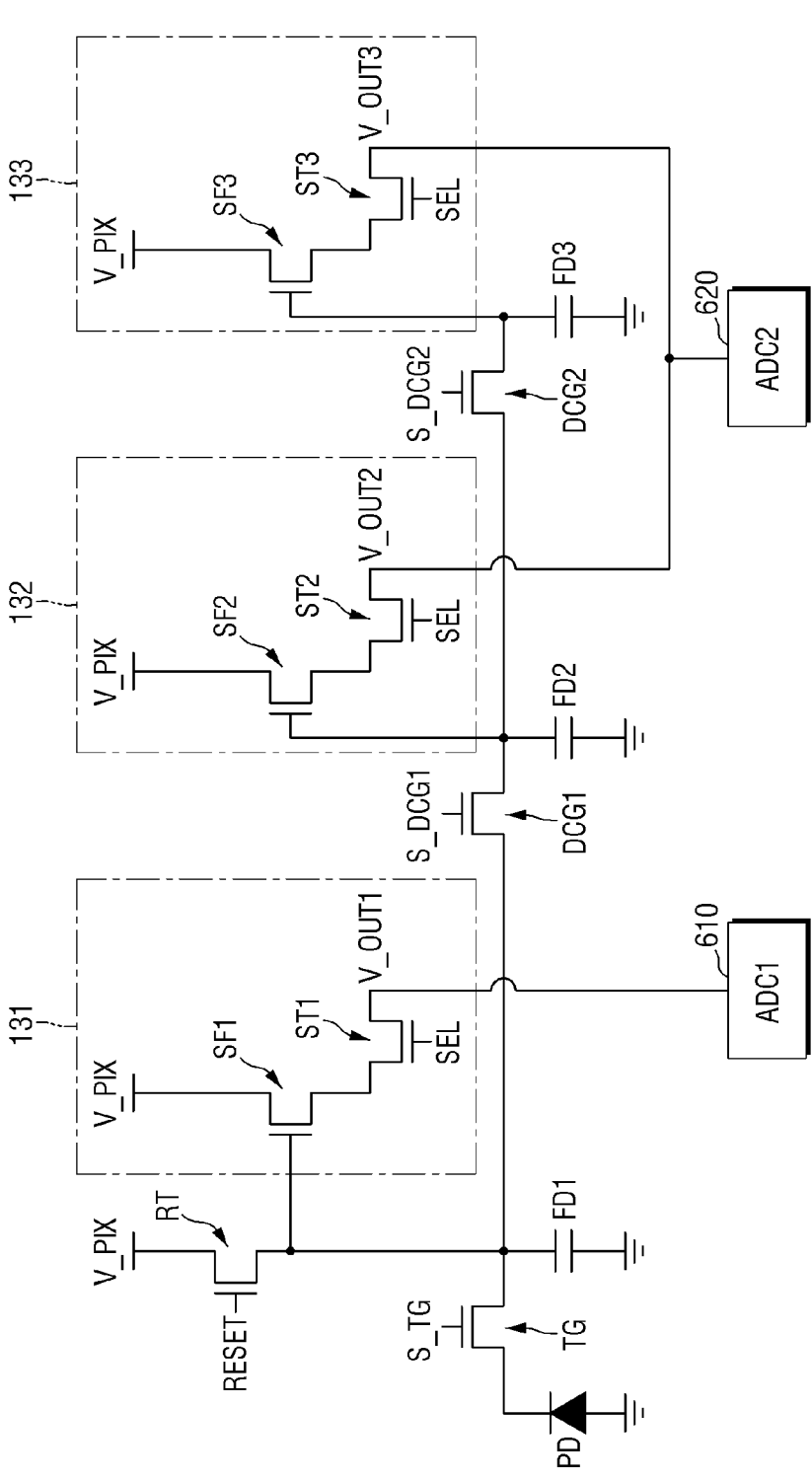
FIG. 24 is a circuit diagram for explaining the structure of pixels included in a pixel array of FIG. 23, according to an embodiment.

FIG. 24 is a circuit diagram for explaining the structure of the pixels included in the pixel array of FIG. 23. Hereinafter, differences from FIGS. 3 and 17A will be mainly explained.

Referring to FIG. 24, the pixel 130 may include a photoelectric element PD, a reset transistor RT that resets the voltage levels of the first to third floating diffusions FD1, FD2 and FD3 to the reset level V_RST, a transfer gate TG that transmits the electric charge generated by the photoelectric element PD to the first to third floating diffusions FD1, FD2 and FD3, a first DCG transistor DCG1 that connects the first floating diffusion FD1 and the second floating diffusion FD2, a second DCG transistor DCG2 that connects the second floating diffusion FD2 and the third floating diffusion FD3, and first pixel circuit 131, second pixel circuit 132 and third pixel circuit 133. The first to third pixel circuits 131, 132 and 133 may be similar to the first to third pixel circuits 121, 122 and 123 of FIG. 17A.

The first output voltage V_OUT1 that is output from an output end of the first pixel circuit 131 may be provided to a first analog to digital converter 610. The second and third output voltages V_OUT2 and V_OUT3 that are output from the output ends of the second and third pixel circuits 132 and 133 may be provided to the second analog to digital converter 620.

The operation of FIG. 24 may be similar to the operation of FIG. 3 described referring to FIGS. 4 to 10. That is, different output voltages V_OUT1, V_OUT2 and V_OUT3 may be output at the same time, by electrically separating the first to third floating diffusions FD1, FD2 and FD3 from each other, and by simultaneously sensing the voltages of the respective floating diffusions using the first to third pixel circuits 131, 132 and 133.

Figure 25:
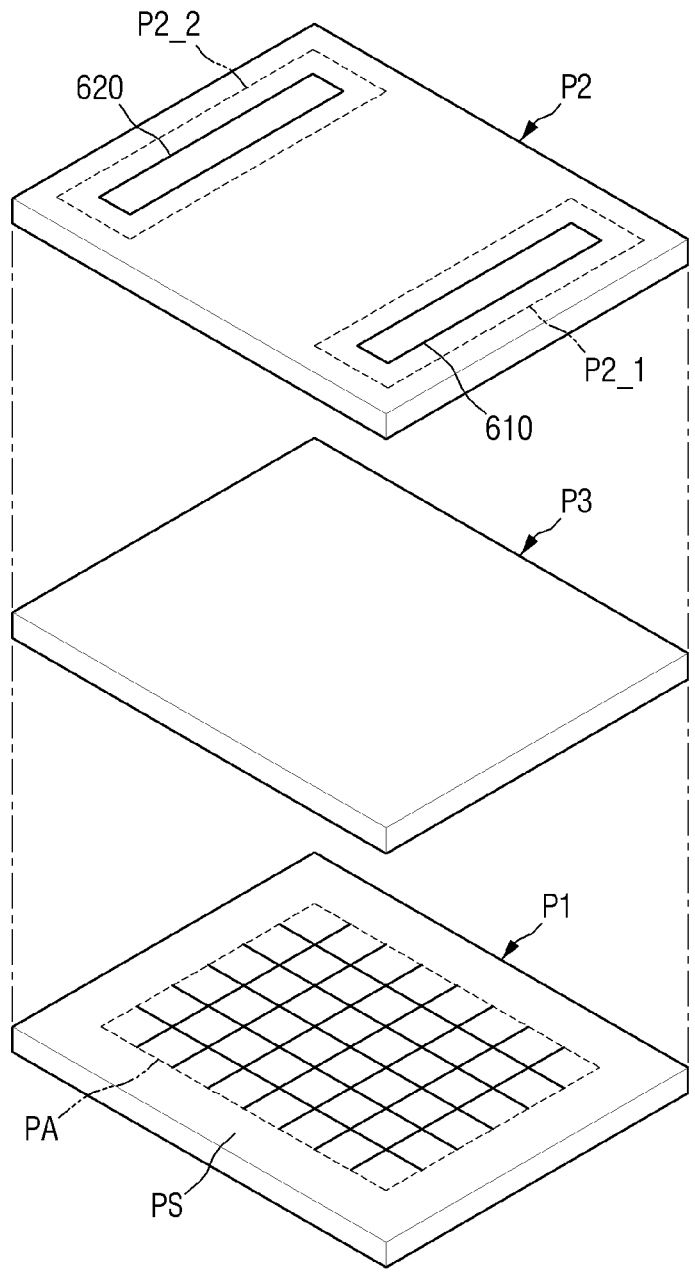

FIG. 25 is a diagram for explaining a stacked structure of an image sensing device according to some other embodiments. The stacked structure shown in FIG. 25 may be similar to the stacked structure of the image sensing device of FIG. 15.

Referring to FIG. 25, the second plate P2 may include a first area P2_1 and a second area P2_2. The second area P2_2 may be formed to be physically separated from the first area P2_1. In this case, the first analog to digital converter 610 may be placed in the first area P2_1, and the second analog to digital converter 620 may be placed in the second area P2_2. The logic circuit 200 may be placed in the pixel periphery area PS or in the third plate P3.

Figure 26:
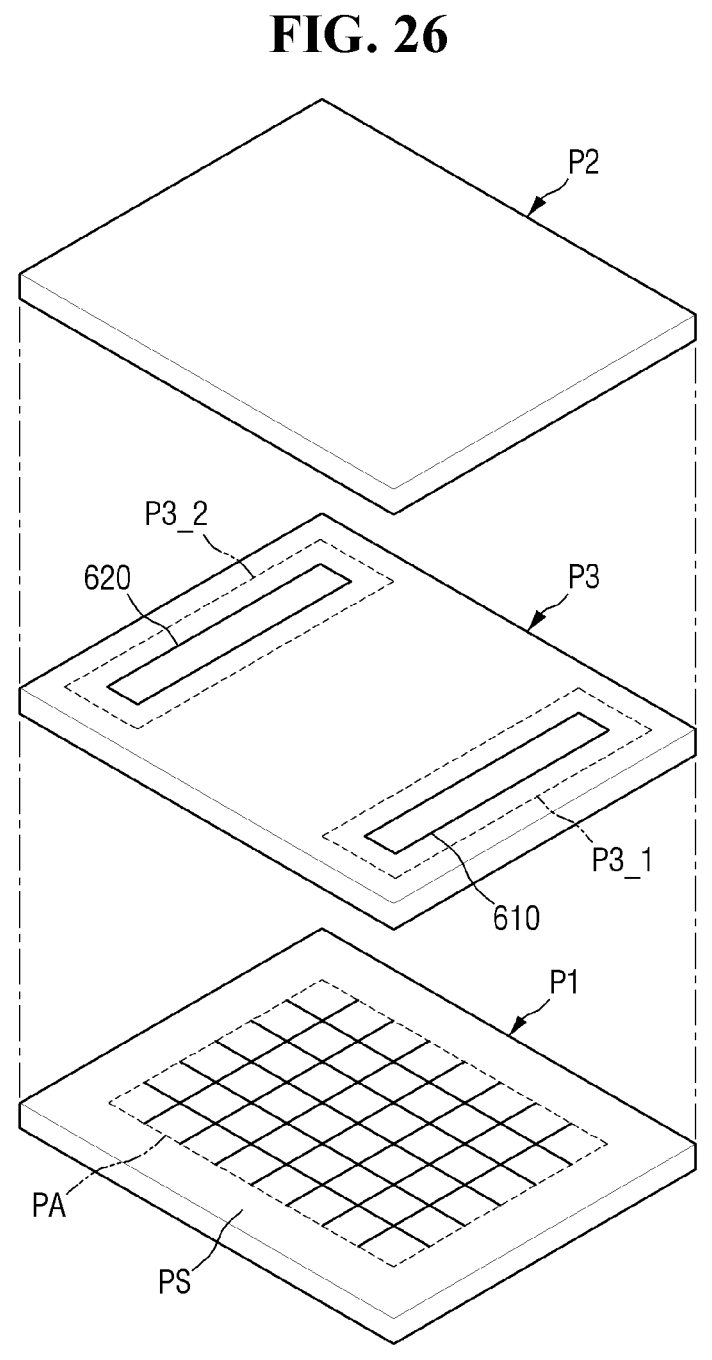

FIG. 26 is a diagram for explaining a stacked structure of an image sensing device according to some other embodiments. The stacked structure of FIG. 26 may be similar to the stacked structure of the image sensing device of FIG. 14.

Referring to FIG. 26, the third plate P3 may include a first area P3_1 and a second area P3_2. The second area P3_2 may be formed to be physically separated from the first area P3_1. In this case, the first analog to digital converter 610 may be placed in the first area P3_1, and the second analog to digital converter 620 may be placed in the second area P3_2. The logic circuit 200 may be placed in the pixel periphery area PS or in the second plate P2.

Figure 27:
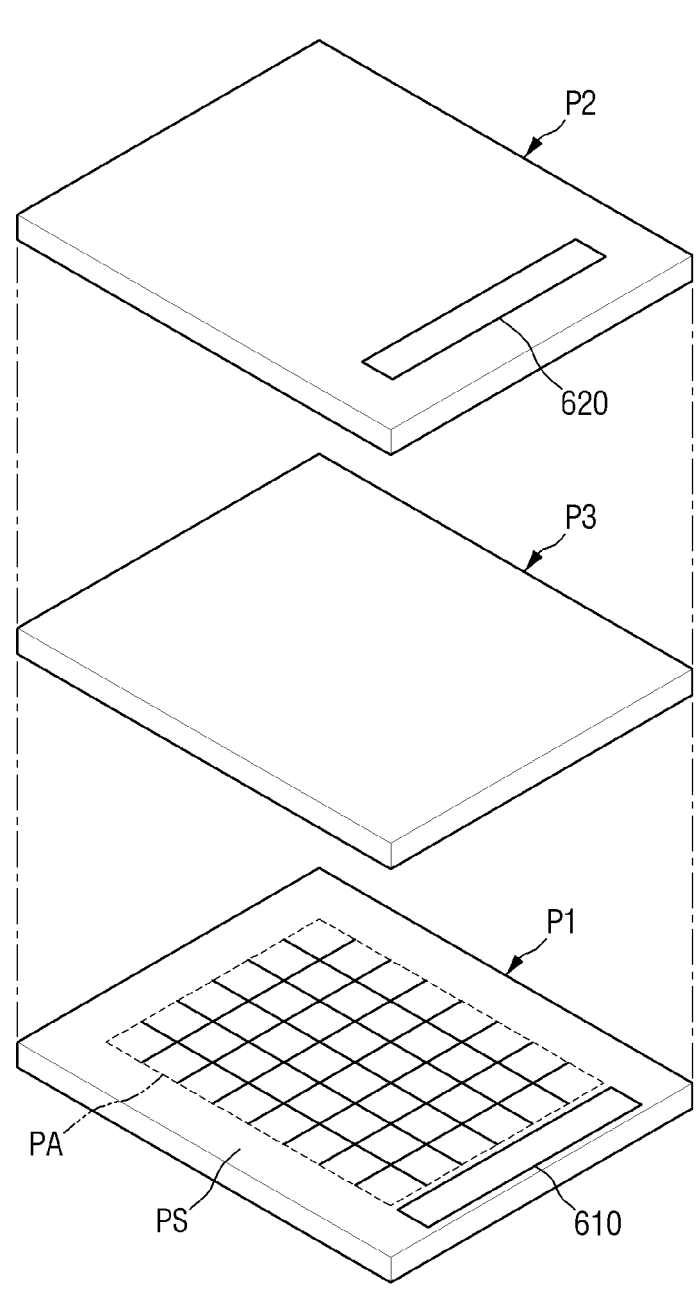

FIG. 27 is a diagram for explaining a stacked structure of an image sensing device according to some other embodiments. The stacked structure shown in FIG. 27 may be similar to the stacked structure of the image sensing device of FIG. 22.

Referring to FIG. 27, the first analog to digital converter 610 may be placed in the pixel periphery area PS of the first plate P1. The second analog to digital converter 620 may be placed on the second plate P2. The logic circuit 200 may be placed in the pixel periphery area PS or in the third plate P3.

Figure 28:
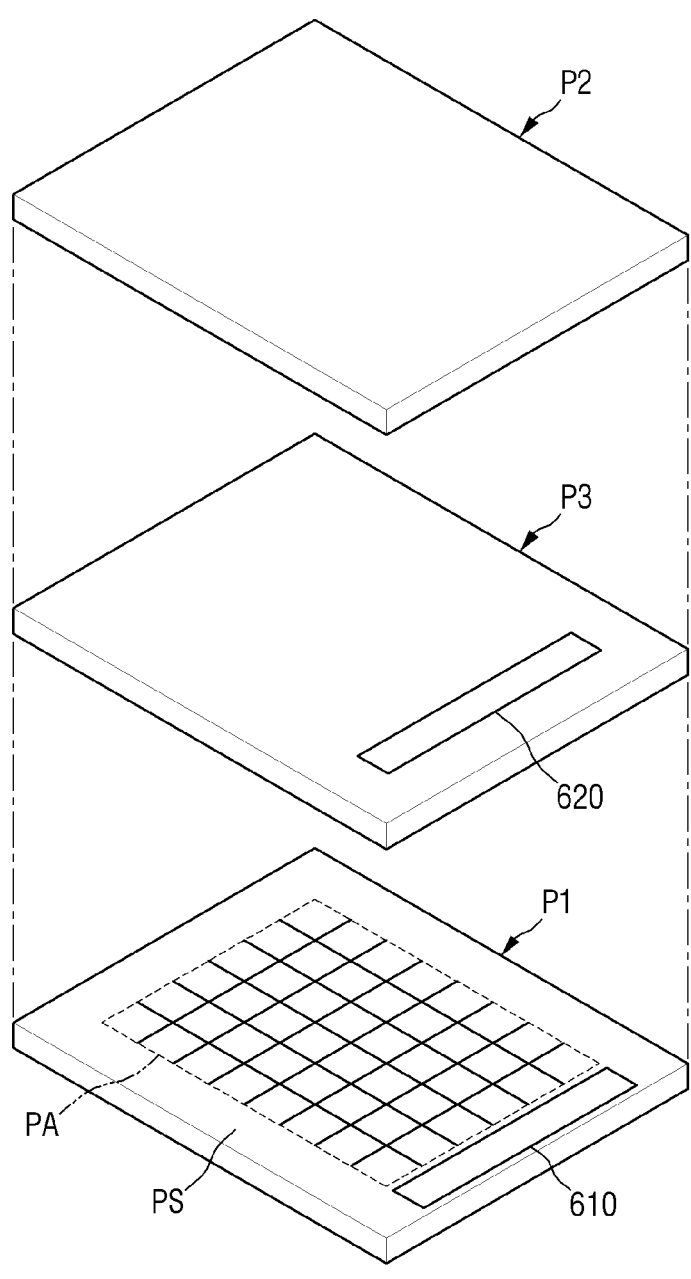

FIG. 28 is a diagram for explaining a stacked structure of an image sensing device according to some other embodiments. The stacked structure of FIG. 28 may be similar to the stacked structure of the image sensing device of FIG. 27.

Referring to FIG. 28, the first analog to digital converter 610 may be placed in the pixel periphery area PS of the first plate P1. The second analog to digital converter 620 may be placed on the third plate P3. The logic circuit 200 may be placed in the pixel periphery area PS or in the second plate P2.

Figure 29:
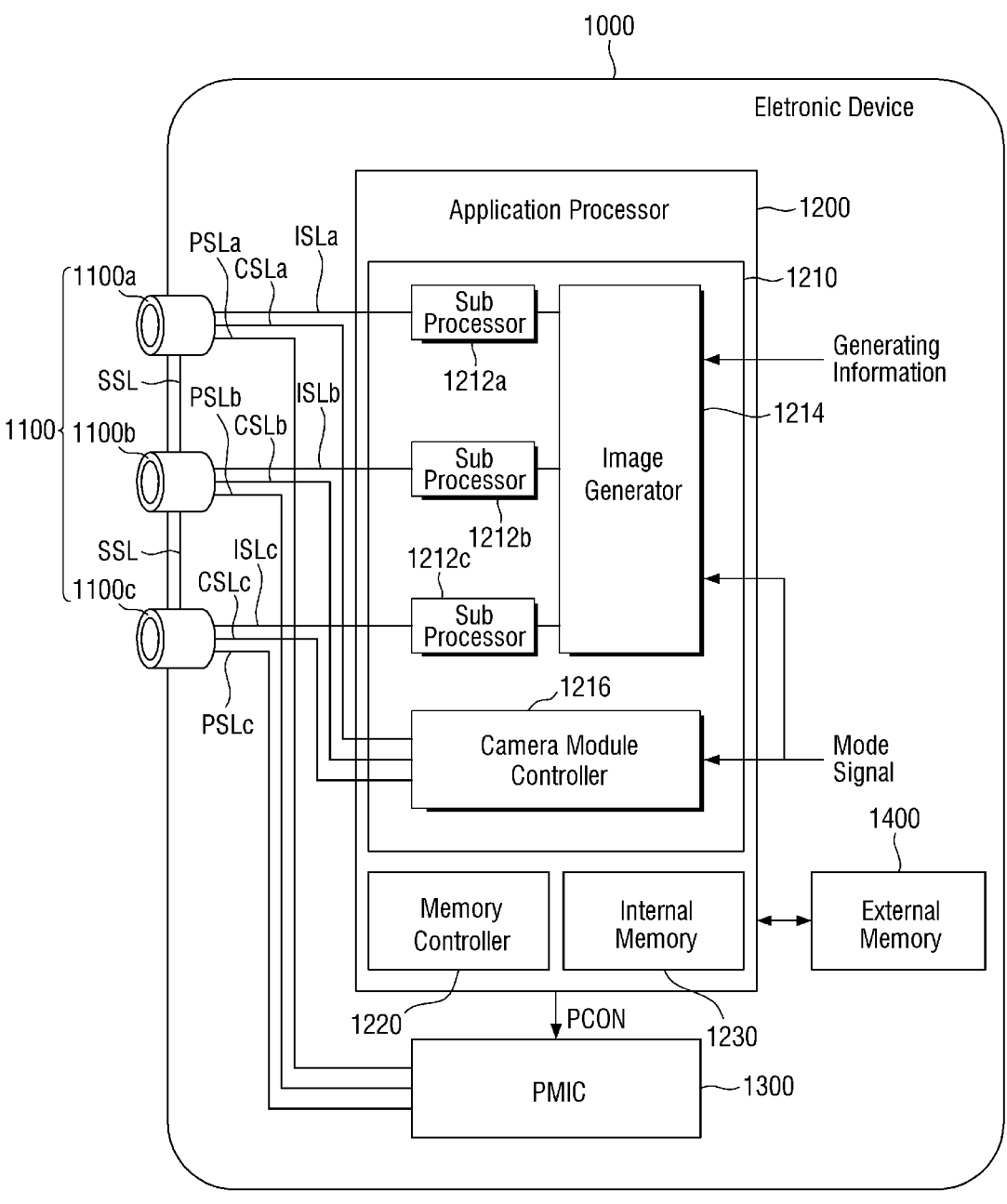
FIGS. 29 and 30 are block diagrams of an electronic device including a multi-camera module, according to an embodiment.
Figure 30:
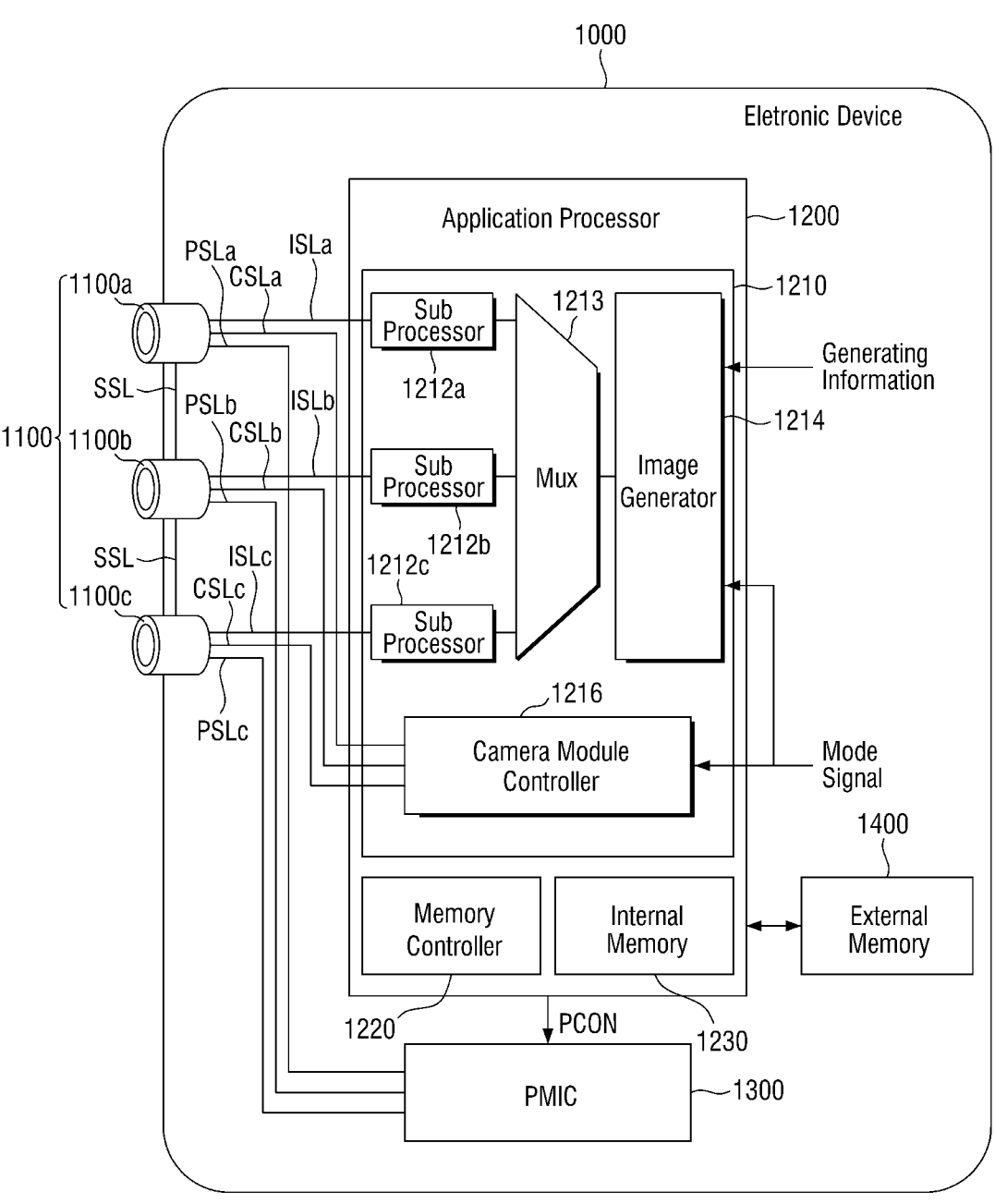
Figure 31:
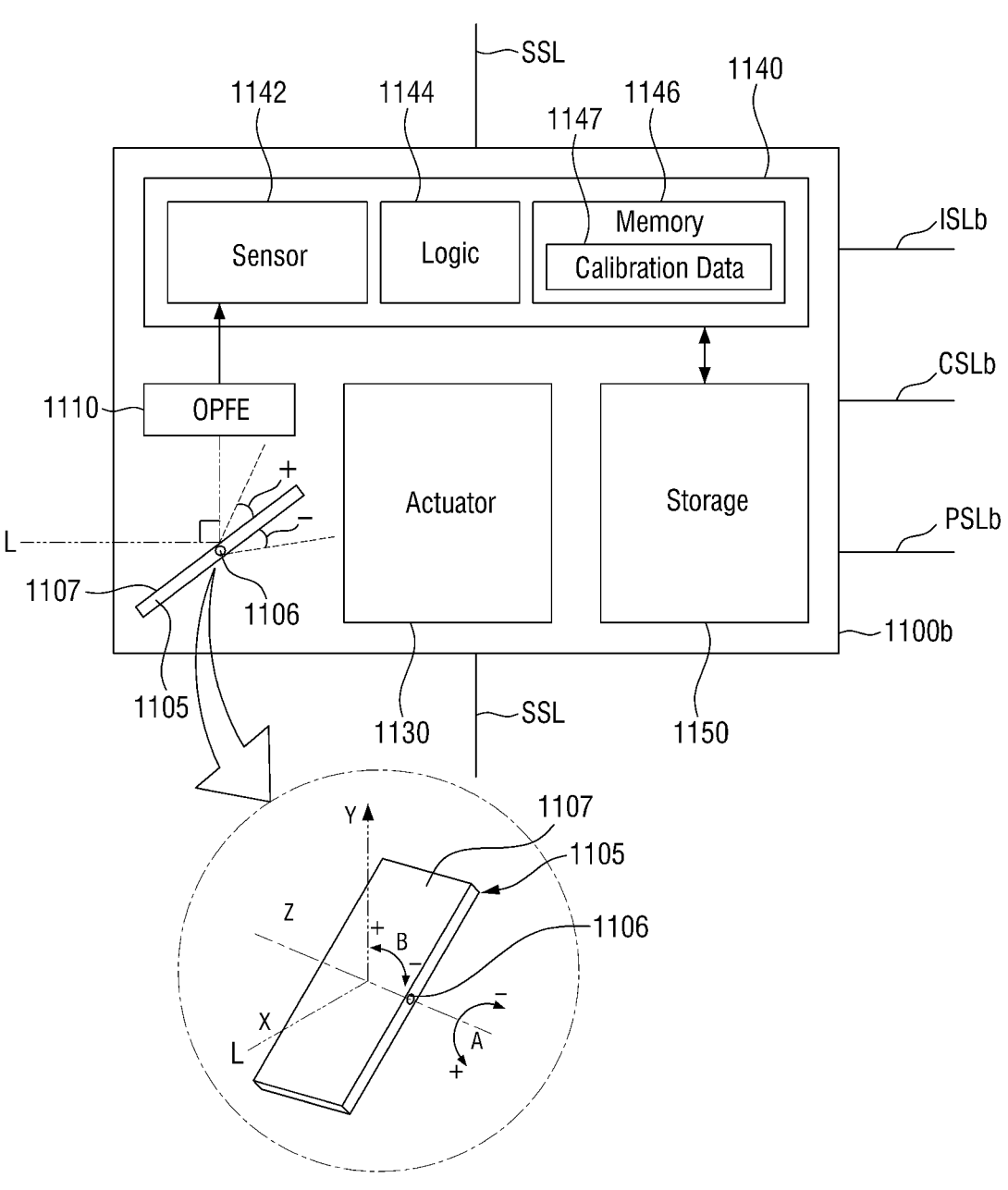
FIG. 31 is a detailed block diagram of the camera module of FIGS. 29 and 30, according to an embodiment.

FIGS. 29 and 30 are block diagrams of an electronic device including a multi-camera module. FIG. 31 is a detailed block diagram of the camera module of FIGS. 29 and 30. Hereinafter, an image sensing device 1140 may be similar to the image sensing device 1 shown in FIG. 1, the image sensing device 2 shown in FIG. 16, and the image sensing device 3 shown in FIG. 23.

Referring to FIG. 29, an electronic device 1000 may include a camera module group 1100, an application processor 1200, a power management integrated circuit (PMIC) 1300, and an external memory 1400.

The camera module group 1100 may include a plurality of camera modules 1100*a*, 1100*b* and 1100*c*. Even if the drawing shows an embodiment in which the three camera modules 1100*a*, 1100*b* and 1100*c* are placed, the embodiments are not limited thereto. In some embodiments, the camera module group 1100 may be modified to include only two camera modules or include n (where n may be a natural number equal to or greater than 4) camera modules.

Hereinafter, although a detailed configuration of a camera module 1100*b* will be described more specifically referring to FIG. 31, the following description may also be equally applied to other camera modules 1100*a* and 1100*c* depending on the embodiments.

Referring to FIG. 31, the camera module 1100*b* may include a prism 1105, an optical path folding element (hereinafter, "OPFE") 1110, an actuator 1130, an image sensing device 1140, and a storage unit 1150.

The prism 1105 may include a reflecting surface 1107 of a light-reflecting material to change a path of light L that is incident from the outside.

In some embodiments, the prism 1105 may change the path of light L incident in the first direction X to a second direction Y perpendicular to the first direction X. Further, the prism 1105 may rotate the reflecting surface 1107 of the light-reflecting material in a direction A around a central axis 1106 or rotate the central axis 1106 in a direction B to change the path of the light L incident in the first direction X into the vertical second direction Y. At this time, the OPFE 1110 may also move in a third direction Z that is perpendicular to the first direction X and the second direction Y.

In some embodiments, as shown, although a maximum rotation angle of the prism 1105 in the direction A is equal to or less than 15 degrees in a positive (+) direction A, and may be greater than 15 degrees in a negative (−) direction A, the embodiments are not limited thereto.

In some embodiments, the prism 1105 may move about 20 degrees, or between 10 and 20 degrees, or between 15 and 20 degrees in the positive (+) or negative (−) direction B. Here, a moving angle may move at the same angle in the positive (+) or negative (−) direction B, or may move to almost the same angle within the range of about 1 degree.

In some embodiments, the prism 1105 may move the reflecting surface 1107 of the light-reflecting material in the third direction (e.g., a direction Z) parallel to an extension direction of the central axis 1106.

In some embodiments, the camera module 1100b may be made up of two or more prisms, which makes it possible to change the path of light L, which is incident in the first direction X, in the second direction Y perpendicular to the direction X, again in the first direction X or the third direction Z, and again in the second direction Y or the like in various ways.

The OPFE 1110 may include, for example, an optical lens including m (here, m is a natural number) groups. The m lenses may move in the second direction Y to change an optical zoom ratio of the camera module 1100b. For example, when a basic optical zoom ratio of the camera module 1100b is defined as Z, if the m optical lenses included in the OPFE 1110 are moved, the optical zoom ratio of the camera module 1100b may be changed to the optical zoom ratio of 3 Z or 5 Z or higher.

The actuator 1130 may move the OPFE 1110 or an optical lens (hereinafter, referred to as an optical lens) to a specific position. For example, the actuator 1130 may adjust the position of the optical lens so that an image sensor 1142 is located at a focal length of the optical lens for accurate sensing.

The image sensing device 1140 may include an image sensor 1142, control logic 1144 and a memory 1146. The image sensor 1142 may sense an image to be sensed, using light L provided through the optical lens. The control logic 1144 may control the overall operation of the camera module 1100b, and process the sensed image. For example, the control logic 1144 may control the operation of the camera module 1100b in accordance with the control signal provided through a control signal line CSLb, and may extract image data (e.g., a person's face, arms, legs, etc. in the image) corresponding to a particular image in the sensed image.

In some embodiments, the control logic 1144 may perform image processing such as encoding and noise reduction of the sensed image.

The memory 1146 may store information necessary for the operation of the camera module 1100b such as calibration data 1147. The calibration data 1147 may include information necessary for the camera module 1100b to generate image data, using the light L provided from the outside, for example, information on a degree of rotation, information on a focal length, information on an optical axis, and the like. When the camera module 1100b is implemented in the form of a multi-state camera whose focal length changes depending on the position of the optical lens, the calibration data 1147 may include information about the focal length values for each position (or for each state) of the optical lens and auto focusing.

The storage unit 1150 may store the image data sensed through the image sensor 1142. The storage unit 1150 may be placed outside the image sensing device 1140, and may be implemented in the form of being stacked with sensor chips included in the image sensing device 1140. In some embodiments, the image sensor 1142 is configured as a first plate, and the control logic 1144, the storage unit 1150 and the memory 1146 are configured as the first plate or a second plate and may be provided in a stacked form of a plurality of plates. The stacked structure of the image sensing device 1140 is as described above.

In some embodiments, although the storage unit 1150 may be implemented as an EEPROM (Electrically Erasable Programmable Read-Only Memory), the embodiments are not limited thereto. In some embodiments, the image sensor 1142 is configured as a pixel array and the control logic 1144 may include an analog to digital converter and an image signal processor for processing the sensed image.

Referring to FIGS. 29 and 31 together, in some embodiments, each of the plurality of camera modules 1100a, 1100b, and 1100c may include an actuator 1130. Accordingly, each of the plurality of camera modules 1100a, 1100b, and 1100c may include calibration data 1147 that is the same as or different from each other according to the operation of the actuator 1130 included therein.

In some embodiments, one camera module (e.g., 1100b) among the plurality of camera modules 1100a, 1100b, and 1100c is a folded lens type camera module including the prism 1105 and the OPFE 1110 described above, and the remaining camera modules (e.g., 1100a and 1100c) may be vertical camera modules which do not include the prism 1105 and the OPFE 1110. However, the embodiments are not limited thereto.

In some embodiments, one camera module (e.g., 1100c) among the plurality of camera modules 1100a, 1100b, and 1100c may be a vertical depth camera which extracts depth information, for example, using an infrared (IR) ray or IR light. In this case, the application processor 1200 may merge the image data provided from such a depth camera with the image data provided from another camera module (e.g., 1100a or 1100b) to generate a three-dimensional (3D) depth image.

In some embodiments, at least two camera modules (e.g., 1100a and 1100c) among the plurality of camera modules 1100a, 1100b, and 1100c may have fields of view different from each other. In this case, for example, although the optical lenses of at least two camera modules (e.g., 1100a and 1100c) among the plurality of camera modules 1100a, 1100b, and 1100c may be different from each other, the embodiments are not limited thereto.

Also, in some embodiments, viewing angles of each of the plurality of camera modules 1100a, 1100b, and 1100c may be different from each other. For example, the camera module 1100a may be an ultrawide camera, the camera module 1100*b* may be a wide camera, and the camera module 1100*c* may be a tele camera. However, the embodiments are not limited thereto. In this case, although the optical lenses included in each of the plurality of camera modules 1100*a*, 1100*b*, and 1100*c* may also be different from each other, the embodiments are not limited thereto.

In some embodiments, each of the plurality of camera modules 1100*a*, 1100*b*, and 1100*c* may be placed to be physically separated from each other. That is, a sensing region of one image sensor 1142 is not used separately by the plurality of camera modules 1100*a*, 1100*b*, and 1100*c*, but the independent image sensor 1142 may be placed inside each of the plurality of camera modules 1100*a*, 1100*b*, and 1100*c*.

Referring to FIG. 29 again, the application processor 1200 may include an image processing device 1210, a memory controller 1220, and an internal memory 1230. For example, the application processor 1200 and the plurality of camera modules 1100*a*, 1100*b*, and 1100*c* may be implemented separately as separate semiconductor chips.

The image processing device 1210 may include a plurality of sub-image processors 1212*a*, 1212*b*, and 1212*c*, an image generator 1214, and a camera module controller 1216.

The image processing device 1210 may include a plurality of sub-image processors 1212*a*, 1212*b*, and 1212*c* corresponding to the number of the plurality of camera modules 1100*a*, 1100*b*, and 1100*c*.

The image data generated from the camera module 1100*a* is provided to the sub-image processor 1212*a* through an image signal line ISLa, the image data generated from the camera module 1100*b* is provided to the sub-image processor 1212*b* through an image signal line ISLb, and the image data generated from the camera module 1100*c* may be provided to the sub-image processor 1212*c* through an image signal line ISLc. Although such an image data transmission may be performed using, for example, a camera serial interface (CSI) on the basis of a mobile industry processor interface (MIPI), the embodiments are not limited thereto.

However, in some embodiments, a single sub-image processor may be placed to correspond to a plurality of camera modules. For example, the sub-image processor 1212*a* and the sub-image processor 1212*c* may not be implemented separately from each other as shown, but may be implemented by being integrated as a single sub-image processor. The image data provided from the camera module 1100*a* and the camera module 1100*c* may be selected through a selection element (e.g., a multiplexer) or the like, and then provided to an integrated sub-image processor. At this time, the sub-image processor 1212*b* is not integrated, but may be provided with the image data from the camera module 1100*b*.

Also, in some embodiments, the image data generated from the camera module 1100*a* is provided to the sub-image processor 1212*a* through the image signal line ISLa, the image data generated from the camera module 1100*b* is provided to the sub-image processor 1212*b* through the image signal line ISLb, and the image data generated from the camera module 1100*c* may be provided to the sub-image processor 1212*c* through the image signal line ISLc. Further, although the image data processed by the sub-image processor 1212*b* is directly provided to the image generator 1214, any one of the image data processed by the sub-image processor 1212*a* and the image data processed by the sub-image processor 1212*c* may be provided to the image generator 1214, after being selected through a selection element (e.g., a multiplexer) or the like.

Each of the sub-image processors 1212*a*, 1212*b* and 1212*c* may perform image processing such as a bad pixel correction, a 3A adjustment (Auto-focus correction, Auto-white balance, and Auto-exposure), a noise reduction, sharpening, a gamma control, and a remosaic on the image data provided from the camera modules 1100*a*, 1100*b* and 1100*c*.

In some embodiments, the remosaic signal processing may also be performed on the respective camera modules 1100*a*, 1100*b* and 1100*c* and then provided to the sub-image processors 1212*a*, 1212*b* and 1212*c*.

The image data processed by each of the sub-image processors 1212*a*, 1212*b* and 1212*c* may be provided to the image generator 1214. The image generator 1214 may generate an output image, using the image data provided from the respective sub-image processors 1212*a*, 1212*b* and 1212*c* in accordance with the image generating information (illustrated as "Generating Information") or the mode signal (illustrated as "Mode Signal").

Specifically, the image generator 1214 may merge and output at least a part of the image data generated from the image processing processor 1212*a*, 1212*b* and 1212*c* in accordance with the image generating information or the mode signal. Further, the image generator 1214 may select any one of the image data generated from the image processors 1212*a*, 1212*b* and 1212*c* in accordance with the image generating information or the mode signal and generate an output image.

In some embodiments, the image generating information may include a zoom signal (or a zoom factor). Also, in some embodiments, the mode signal may be, for example, a signal based on the mode selected from a user.

When the image generating information is a zoom signal (a zoom factor) and each of the camera modules 1100*a*, 1100*b*, and 1100*c* has fields of view (viewing angles) different from each other, the image generator 1214 may perform different operations depending on the type of zoom signals. For example, when the zoom signal is a first signal, an output image may be generated, using the image data output from the sub-image processor 1212*a* and the image data output from the sub-image processor 1212*b*, among the image data output from the sub-image processor 1212*a* the image data output from the sub-image processor 1212*c*. If the zoom signal is a second signal that is different from the first signal, the image generator 1214 may generate the output data, using the image data output from the sub-image processor 1212*c* and the image data output from the sub-image processor 1212*b*, among the image data output from the sub-image processor 1212*a* and the image data output from the sub-image processor 1212*c*. If the zoom signal is a third signal different from the first and second signals, the image generator 1214 does not merge the image data, and may select any one of the image data output from the respective sub-image processors 1212*a*, 1212*b* and 1212*c* to generate the output image. However, the embodiments are not limited thereto, and a method of processing the image data may be modified as much as necessary.

Referring to FIG. 30, in some embodiments, the image processing device 1210 may further include a selection unit 1231 that selects the outputs of the sub-image processors 1212*a*, 1212*b* and 1212*c* and transmits it to the image generator 1214.

In this case, the selection unit 1213 may perform different operations depending on the zoom signal and the zoom factor. For example, the selection unit 1213 selects one of the outputs of the sub-image processors 1212*a*, 1212*b* and 1212*c* when the zoom signal is the fourth signal (for example, when the optical zoom ratio is the first magnification), and may transmit it to the image generator 1214.

Further, the selection unit 1213 may sequentially transmit p outputs (p is a natural number of 2 or more) among the outputs of the sub-image processors 1212a, 1212b and 1212c to the image generator 1214, when the zoom signal is a fifth signal different from the fourth signal (for example, when the optical zoom ratio is the second magnification). For example, the selection unit 1213 may sequentially transmit the outputs of the sub-image processor 1212b and the sub-image processor 1212c to the image generator 1214. Further, the selection unit 1213 may sequentially transmit the outputs of the sub-image processor 1212a and the sub-image processor 1212b to the image generator 1214. The image generator 1214 may merge the p outputs provided sequentially to generate a single output image.

Here, image processing such as a demosaic, a down scaling at video/preview resolution size, a gamma correction, and a HDR (High Dynamic Range) processing is performed by the sub-image processors 1212a, 1212b, and 1212c in advance, and then the processed image data is transmitted to the image generator 1214. Accordingly, even if the processed image data is provided to the image generator 1214 by one signal line through the selection unit 1213, the image merge operation of the image generator 1214 may be performed at a high speed.

In some embodiments, the image generator 1214 may receive a plurality of pieces of image data with different exposure times from at least one of the plurality of sub-image processors 1212a, 1212b and 1212c, and perform a high dynamic range (HDR) processing on the plurality of pieces of image data to generate merged image data with an increased dynamic range.

The camera module controller 1216 may provide the control signal to each of the camera modules 1100a, 1100b, and 1100c. The control signals generated from the camera module controller 1216 may be provided to the corresponding camera modules 1100a, 1100b, and 1100c through the control signal lines CSLa, CSLb and CSLc separated from each other.

One of the plurality of camera modules 1100a, 1100b, and 1100c is designated as a master camera (e.g., 1100a) depending on the image generating information including the zoom signal or the mode signal, and the remaining camera modules (e.g., 1100b and 1100c) may be designated as slave cameras. This information is included in the control signal, and may be provided to the corresponding camera modules 1100a, 1100b, and 1100c through the control signal lines CSLa, CSLb and CSLc separated from each other.

The camera modules that operate as master and slave may be changed depending on the zoom factor or the operating mode signal. For example, if the viewing angle of the camera module 1100a is wider than that of the camera module 1100c and the zoom factor exhibits a low zoom ratio, the camera module 1100c may operate as the master, and the camera module 1100a may operate as the slave. In contrast, when the zoom factor exhibits a high zoom ratio, the camera module 1100a may operate as the master and the camera module 1100c may operate as the slave.

In some embodiments, the control signals provided from the camera module controller 1216 to the respective camera modules 1100a, 1100b, and 1100c may include a sync enable signal. For example, if the camera module 1100b is the master camera and the camera modules 1100a and 1100c are the slave cameras, the camera module controller 1216 may transmit the sync enable signal to the camera module 1100b. The camera module 1100b, which receives the sync enable signal, generates a sync signal on the basis of the received sync enable signal, and may provide the generated sync signal to the camera modules 1100a and 1100c through the sync signal line SSL. The camera module 1100b and the camera modules 1100a and 1100c may transmit the image data to the application processor 1200 in synchronization with such a sync signal.

In some embodiments, the control signals provided from the camera module controller 1216 to the plurality of camera modules 1100a, 1100b, and 1100c may include mode information according to the mode signal. On the basis of the mode information, the plurality of camera modules 1100a, 1100b, and 1100c may operate in a first operating mode and a second operating mode in connection with the sensing speed.

The plurality of camera modules 1100a, 1100b, and 1100c may generate an image signal at a first speed in a first operating mode (for example, generate an image signal of a first frame rate), encode the image signal at a second speed higher than the first speed (for example, encode an image signal of a second frame rate higher than the first frame rate), and transmit the encoded image signal to the application processor 1200. At this time, the second speed may be 30 times or less of the first speed.

The application processor 1200 may store the received image signal, that is to say, the encoded image signal, in the internal memory 1230 provided inside or an external memory 1400 of the application processor 1200, and then read and decode the encoded image signal from the internal memory 1230 or the external memory 1400, and display image data generated on the basis of the decoded image signal. For example, the corresponding sub-image processors among the plurality of sub-image processors 1212a, 1212b, and 1212c of the image processing device 1210 may perform the decoding, and may also perform the image processing on the decoded image signal.

A plurality of camera modules 1100a, 1100b, and 1100c may generate image signals at a third speed lower than the first speed in a second operating mode (for example, generate an image signal of a third frame rate lower than the first frame rate), and transmit the image signal to the application processor 1200. The image signal provided to the application processor 1200 may be a non-encoded signal. The application processor 1200 may perform the image processing on the received image signal or store the image signal in the internal memory 1230 or the external memory 1400.

The PMIC 1300 may supply a power, e.g., a power supply voltage, to each of the plurality of camera modules 1100a, 1100b, and 1100c. For example, the PMIC 1300 may supply a first power to the camera module 1100a through a power signal line PSLa, supply a second power to the camera module 1100b through a power signal line PSLb, and supply a third power to the camera module 1100c through a power signal line PSLc, under the control of the application processor 1200.

The PMIC 1300 may generate power corresponding to each of the plurality of camera modules 1100a, 1100b, and 1100c and adjust the level of power, in response to a power control signal PCON from the application processor 1200. The power control signal PCON may include power adjustment signals for each operating mode of the plurality of camera modules 1100a, 1100b, and 1100c. For example, the operating mode may include a low power mode, and at this time, the power control signal PCON may include information about the camera module that operates in the low power mode and a power level to be set. The levels of powers provided to each of the plurality of camera modules 1100a, 1100*b*, and 1100*c* may be the same as or different from each other. Also, the levels of powers may be changed dynamically.

In concluding the detailed description, those skilled in the art will appreciate that many variations and modifications may be made to the preferred embodiments without substantially departing from the principles. Therefore, the disclosed embodiments are used in a generic and descriptive sense only and not for purposes of limitation.

What is claimed is:

1. An image sensing device comprising:
a photoelectric element configured to generate an electric charge in response to light;
a first floating diffusion configured to store the electric charge;
a second floating diffusion configured to store the electric charge;
a third floating diffusion configured to store the electric charge;
a transfer gate, wherein a first end of the transfer gate is connected to the photoelectric element, and a second end of the transfer gate is connected to the first floating diffusion;
a reset transistor directly connected to the first floating diffusion and not directly connected to the second floating diffusion, and configured to reset a voltage of the first floating diffusion and a voltage of the second floating diffusion based on a reset signal;
a first dual conversion gain (DCG) transistor, wherein a first end of the first DCG transistor is directly connected to the first floating diffusion, and a second end of the first DCG transistor is directly connected to the second floating diffusion, and the first DCG transistor is configured to connect the first floating diffusion and the second floating diffusion based on a first DCG control signal;
a second DCG transistor, wherein a first end of the second DCG transistor is directly connected to the second floating diffusion, and a second end of the second DCG transistor is directly connected to the third floating diffusion, and the second DCG transistor is configured to connect the second floating diffusion and the third floating diffusion based on a second DCG control signal;
a first pixel circuit configured to generate a first output voltage based on the voltage of the first floating diffusion;
a second pixel circuit configured to generate a second output voltage based on the voltage of the second floating diffusion;
a third pixel circuit configured to generate a third output voltage based on the voltage of the third floating diffusion;
a first analog to digital converter configured to receive the first output voltage and convert the first output voltage into a first digital signal;
a second analog to digital converter separate from the first analog to digital converter, and configured to receive the second output voltage and convert the second output voltage into a second digital signal; and
a third analog to digital converter separate from the first analog to digital converter and the second analog to digital converter, wherein the third analog to digital converter is configured to receive the third output voltage, and convert the third output voltage into a third digital signal, wherein the first pixel circuit includes a first source follower transistor and the second pixel circuit includes a second source follower transistor,
wherein a gate terminal of the first source follower transistor is directly connected to the first floating diffusion and a gate terminal of the second source follower transistor is directly connected to the second floating diffusion,
wherein the second floating diffusion is not directly connected to any transfer transistor, and
wherein the first analog to digital converter is disposed on a first plate, and the second analog to digital converter is disposed on a second plate different from the first plate.

2. The image sensing device of claim 1,
wherein a threshold voltage of the first source follower transistor is different from a threshold voltage of the second source follower transistor.

3. The image sensing device of claim 1, wherein a capacitance of the first floating diffusion is different from a capacitance of the second floating diffusion.

4. The image sensing device of claim 1, wherein a first end of the reset transistor is directly connected to the first floating diffusion and a second end of the reset transistor is connected to a pixel voltage source.

5. An image sensing device comprising:
a first pixel circuit configured to generate and output a first output voltage using a first conversion technique based on electric charge generated by a single photoelectric element;
a first analog to digital converter configured to receive the first output voltage and convert the first output voltage into a first digital signal;
a second pixel circuit configured to generate and output a second output voltage different from the first output voltage using a second conversion technique based on the electric charge generated by the single photoelectric element;
a second analog to digital converter configured to receive the second output voltage and convert the second output voltage to a second digital signal;
a third pixel circuit configured to generate and output a third output voltage different from the first output voltage and the second output voltage using a third conversion technique different from the first conversion technique and the second conversion technique, based on the electric charge provided from the single photoelectric element; and
a third analog to digital converter configured to receive the third output voltage and convert the third output voltage into a third digital signal,
wherein the first analog to digital converter is disposed on a first plate, and
wherein the second analog to digital converter is disposed on a second plate different from the first plate.

6. The image sensing device of claim 5, wherein the second plate includes a first area and a second area formed to be physically separated from the first area,
wherein the second analog to digital converter is disposed in the first area, and
wherein the third analog to digital converter is disposed in the second area.

7. The image sensing device of claim 5, wherein the third analog to digital converter is disposed on a third plate formed between the first plate and the second plate.

* * * * *